United States Patent
Jang et al.

(10) Patent No.: US 11,133,232 B2
(45) Date of Patent: Sep. 28, 2021

(54) SEMICONDUCTOR DEVICE, METHOD OF TESTING SEMICONDUCTOR DEVICE AND METHOD OF MANUFACTURING SEMICONDUCTOR DEVICE

(71) Applicant: SAMSUNG ELECTRONICS CO., LTD., Suwon-si (KR)

(72) Inventors: Ae-Nee Jang, Seoul (KR); Seung-Duk Baek, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 31 days.

(21) Appl. No.: 16/417,826

(22) Filed: May 21, 2019

(65) Prior Publication Data

US 2020/0144138 A1 May 7, 2020

(30) Foreign Application Priority Data

Nov. 5, 2018 (KR) .................. 10-2018-0134313

(51) Int. Cl.
| | |
|---|---|
| H01L 21/66 | (2006.01) |
| H01L 27/02 | (2006.01) |
| G01R 31/00 | (2006.01) |
| G01R 31/28 | (2006.01) |
| H02H 9/04 | (2006.01) |

(52) U.S. Cl.
CPC ............ *H01L 22/34* (2013.01); *G01R 31/002* (2013.01); *G01R 31/2884* (2013.01); *H01L 22/32* (2013.01); *H01L 27/0262* (2013.01); *H01L 27/0288* (2013.01); *H01L 22/20* (2013.01); *H02H 9/046* (2013.01)

(58) Field of Classification Search
CPC ...... H01L 22/30; H01L 22/34; H01L 27/0288; G01R 31/2884
See application file for complete search history.

(56) References Cited

U.S. PATENT DOCUMENTS

| | | | | |
|---|---|---|---|---|
| 4,763,184 A | * | 8/1988 | Krieger | ............... H01L 27/0251 257/358 |
| 5,561,373 A | * | 10/1996 | Itoh | ........................ H01L 22/14 257/E21.531 |
| 5,835,327 A | | 11/1998 | Siew et al. | |
| 6,055,143 A | * | 4/2000 | Yu | ........................... G11C 7/24 361/56 |
| 6,775,112 B1 | | 8/2004 | Smith et al. | |

(Continued)

FOREIGN PATENT DOCUMENTS

| | | |
|---|---|---|
| JP | 5576473 B2 | 8/2014 |
| KR | 10-1107932 B1 | 1/2012 |

*Primary Examiner* — John A Bodnar
(74) *Attorney, Agent, or Firm* — Sughrue Mion, PLLC

(57) ABSTRACT

A semiconductor device is provided. The semiconductor device includes a functional circuit; a plurality of electrostatic discharge (ESD) protection circuits formed independently of the functional circuit, wherein each of the plurality of ESD protection circuits includes a plurality of junctions having different sizes and capacities, each of the plurality of ESD protection circuits is configured to perform an ESD test in different processes of fabrication of the semiconductor device; and a plurality of test pads connected to the plurality of ESD protection circuits and the functional circuit, respectively, wherein each of the plurality of test pads is configured to receive a test signal for the ESD test.

19 Claims, 18 Drawing Sheets

(56) References Cited

U.S. PATENT DOCUMENTS

| | | |
|---|---|---|
| 7,432,555 B2 | 10/2008 | Williams et al. |
| 7,440,865 B1 | 10/2008 | Hofmeister et al. |
| 7,694,247 B2 | 4/2010 | Esmark et al. |
| 8,264,233 B2 | 9/2012 | Wallash |
| 8,281,268 B2 | 10/2012 | Yang et al. |
| 8,594,957 B2 | 11/2013 | Gauthier et al. |
| 8,760,827 B2 | 6/2014 | Campi, Jr. et al. |
| 9,435,842 B2 | 9/2016 | Vaucher et al. |
| 9,599,649 B2 | 3/2017 | Min et al. |
| 9,871,373 B2 | 1/2018 | O'Donnell et al. |
| 2010/0225347 A1* | 9/2010 | Worley ............... G01R 31/002 324/762.06 |
| 2018/0088163 A1 | 3/2018 | Chang et al. |
| 2018/0100890 A1 | 4/2018 | Duvvury et al. |

\* cited by examiner

SEMICONDUCTOR DEVICE, METHOD OF TESTING SEMICONDUCTOR DEVICE AND METHOD OF MANUFACTURING SEMICONDUCTOR DEVICE

CROSS-REFERENCE TO RELATED APPLICATION

This application claims priority from Korean Patent Application No. 10-2018-0134313, filed on Nov. 5, 2018 in the Korean Intellectual Property Office, the contents of which are herein incorporated by reference in their entirety.

BACKGROUND

1. Technical Field

Methods and apparatuses consistent with example embodiments relate to semiconductor integrated circuits, and more particularly to semiconductor devices for detecting and tracing electrostatic discharge (ESD) failure, methods of testing the semiconductor devices, and methods of manufacturing the semiconductor devices.

2. Related Art

As the size of semiconductor devices decrease and the density of semiconductor devices increases, an ESD protection device, which protects the semiconductor device from damage caused by an ESD, becomes more important. In related devices, a diode, a resistor, and a transistor are used for ESD protection. Also, a silicon controlled rectifier (SCR) is used for ESD protection.

In the manufacturing process of the semiconductor device, an ESD may render the semiconductor device defective. However, the defect of the semiconductor device may not be accurately detected and traced. For example, when the semiconductor device is tested and the defect of the semiconductor device is detected, the cause of the defect may be estimated by analyzing the type of the defect and the possible causes, but the exact cause of the defect and the exact occurrence process of the defect may not be identified.

SUMMARY

One or more example embodiments provide a semiconductor device capable of efficiently detecting and tracing an ESD failure or a defect due to an ESD.

One or more example embodiments provide a method of testing a semiconductor device capable of efficiently detecting and tracing an ESD failure or a defect due to an ESD.

One or more example embodiments provide a method of manufacturing a semiconductor device capable of efficiently detecting and tracing an ESD failure or a defect due to an ESD.

According to an aspect of an example embodiment, there is provided a semiconductor device that includes: a functional circuit; a plurality of electrostatic discharge (ESD) protection circuits formed independently of the functional circuit, wherein each of the plurality of ESD protection circuits includes a plurality of junctions having different sizes and capacities, each of the plurality of ESD protection circuits is configured to perform an ESD test in different processes of fabrication of the semiconductor device; and a plurality of test pads connected to the plurality of ESD protection circuits and the functional circuit, respectively, wherein each of the plurality of test pads is configured to receive a test signal for the ESD test.

According to an aspect of an example embodiment, there is provided a method of testing a semiconductor device, the method including: performing a first test operation on the semiconductor device disposed on a wafer using a functional circuit and a first electrostatic discharge (ESD) protection circuit from among a plurality of ESD protection circuits included in the semiconductor device, wherein the plurality of ESD protection circuits is formed independently of the functional circuit, and each of the plurality of ESD protection circuits includes a plurality of junctions having different sizes and capacities; detaching the semiconductor device from the wafer; assembling the semiconductor device that has been detached from the wafer into a semiconductor package; and performing a second test operation on the semiconductor package including the semiconductor device using the functional circuit and a second ESD protection circuit, from among the plurality of ESD protection circuits, included in the semiconductor device.

According to an aspect of an example embodiment, there is provided a method of manufacturing a semiconductor device, the method including: fabricating a wafer including the semiconductor device, wherein the semiconductor device includes a functional circuit and a plurality of electrostatic discharge (ESD) protection circuits formed independently of the functional circuit, and each of the plurality of ESD protection circuits includes a plurality of junctions having different sizes and capacities; performing a first test operation on the semiconductor device disposed on the wafer using the functional circuit and a first ESD protection circuit from among the plurality of ESD protection circuits; detaching the semiconductor device from the wafer; assembling the semiconductor device into a semiconductor package; and performing a second test operation on the semiconductor package including the semiconductor device using the functional circuit and a second ESD protection circuit from among the plurality of ESD protection circuits.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Figure 1:
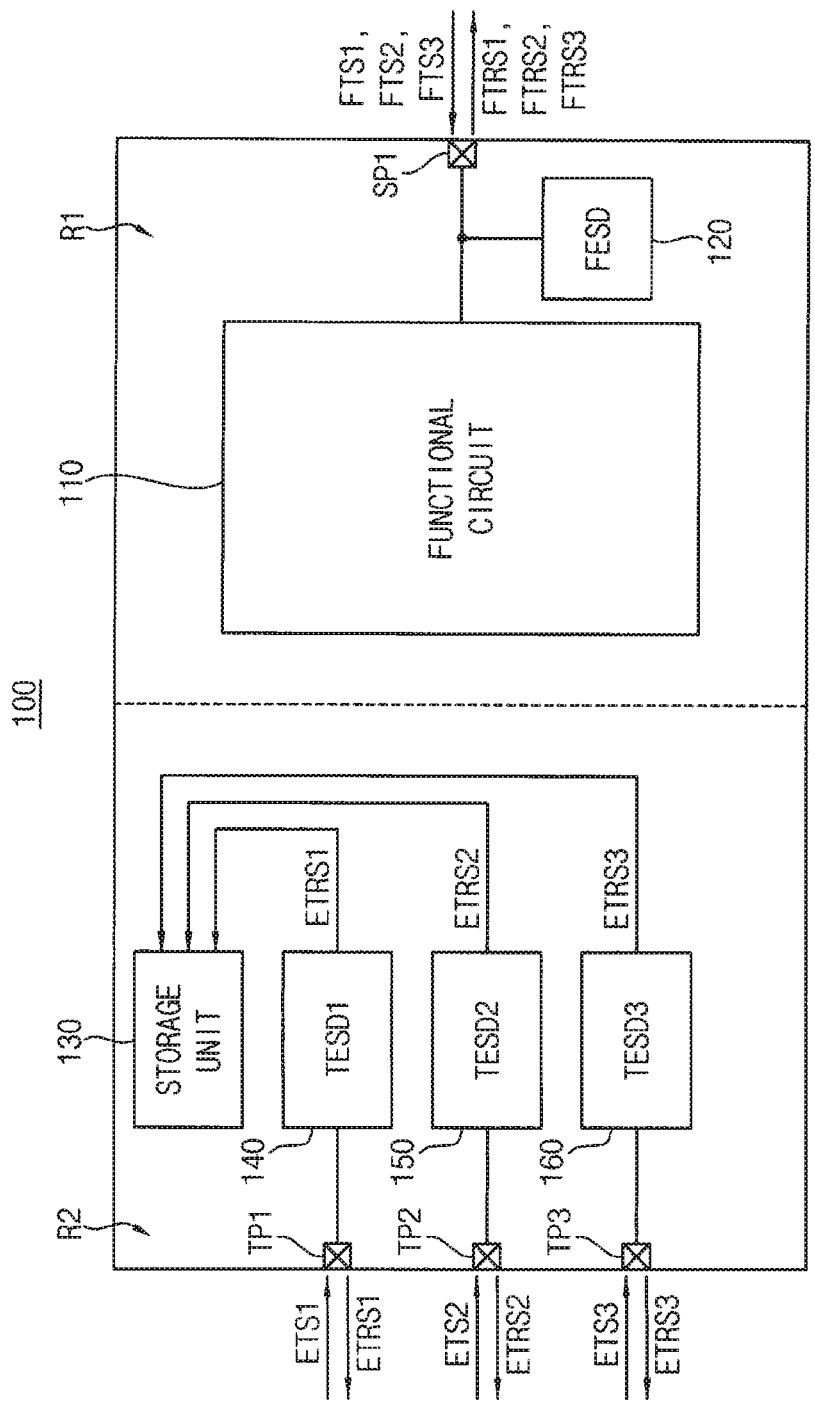
FIG. 1 is a block diagram illustrating a semiconductor device according to example embodiments.

Various example embodiments will be described more fully with reference to the accompanying drawings, in which example embodiments are shown. The present disclosure may, however, be embodied in many different forms and should not be construed as limited to the example embodiments set forth herein like reference numerals refer to like elements throughout this application.

FIG. 1 is a block diagram illustrating a semiconductor device according to example embodiments.

Referring to FIG. 1, a semiconductor device 100 includes a functional circuit 110, a plurality of ESD protection circuits (TESD1, TESD2 and TESD3) 140, 150 and 160, and a plurality of test pads TP1, TP2 and TP3. The semiconductor device 100 may further include an ESD protection circuit (FESD) 120, a signal pad SP1, and a storage unit 130. The semiconductor device 100 may be referred to as a semiconductor integrated circuit.

The functional circuit 110 is a circuit for an operation of the semiconductor device 100. For example, the functional circuit 110 may perform a predetermined functions or tasks for the operation of the semiconductor device 100.

In some example embodiments, the functional circuit 110 may include at least one memory cell array for storing data, and peripheral circuits (e.g., a control logic, a command decoder, an address register, a row decoder, a column decoder, a data input/output (I/O) buffer, or the like) for accessing the memory cell array. For example, the semiconductor memory device may include at least one of various volatile memories such as a dynamic random access memory (DRAM), a synchronous DRAM (SDRAM), a static random access memory (SRAM), or the like, and/or at least one of various nonvolatile memories such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), a polymer random access memory (PoRAM), or the like.

In other example embodiments, the functional circuit 110 may include at least one processing element (PE) or processor core, and circuits (e.g., an interface circuit, a cache memory, a data I/O buffer, or the like) for providing data to or receiving data output from the processing element. For example, the processing device may include at least one of various processing units or processors such as an application processor (AP), a central processing unit (CPU), a graphic processing unit (GPU), a neural processing unit (NPU), a digital signal processor (DSP), an image signal processor (ISP), or the like.

In still other example embodiments, the functional circuit 110 may include at least one of a plurality of functional blocks such as a display control block, a file system block, a graphic processing block, an image signal processing block, a multi-format codec block, or the like, that are individualized by their own functions.

The signal pad SP1 may be electrically connected to the functional circuit 110, and may receive or output signals associated with an operation of the functional circuit 110 from or to an outside (e.g., an external device). For example, in a test mode, the signal pad SP1 may receive test signals FTS1, FTS2 and FTS3 associated with functional tests and/or may output test result signals FTRS1, FTRS2, FTRS3 associated with the functional tests. In a normal mode, the signal pad SP1 may receive and/or output signals associated with normal operations of the functional circuit 110. For example, a pad may be a contact pad or a contact pin, but example embodiments are not limited thereto.

The ESD protection circuit 120 may be electrically connected to the functional circuit 110 and the signal pad SP1. When an ESD event occurs such that a large amount of electrostatic charge flows in the ESD protection circuit 120 through the signal pad SP1, the ESD protection circuit 120 may be turned on to discharge the electrostatic charge. In other words, the ESD protection circuit 120 may protect the functional circuit 110 from the ESD event. The ESD protection circuit 120 may be referred to as an ESD protection circuit for a functional circuit (FESD).

The plurality of ESD protection circuits 140, 150 and 160 are formed or implemented independently/individually of the functional circuit 110. For example, the functional circuit 110 may be formed or disposed in a first region R1 of the semiconductor device 100, and the plurality of ESD protection circuits 140, 150 and 160 may be formed or disposed in a second region R2 of the semiconductor device 100 that is different from the first region R1. The first region R1 and the second region R2 may be physically separated or distinguished from each other, and thus the functional circuit 110 and the plurality of ESD protection circuits 140, 150 and 160 may be electrically isolated from each other.

Each of the plurality of ESD protection circuits 140, 150 and 160 includes a plurality of junctions having different sizes and capacities, as will be described with reference to FIG. 2 and the like.

Each of the plurality of ESD protection circuits 140, 150 and 160 is used to perform an ESD test in different processes of fabricating the semiconductor device 100, as will be described with reference to FIG. 7 and the like. In other words, the plurality of ESD protection circuits 140, 150 and 160 may not be used to protect the functional circuit 110 and may only be used to perform the ESD test. The plurality of ESD protection circuits 140, 150 and 160 may only operate in the test mode and may not operate in the normal mode. Thus, each of the plurality of ESD protection circuits 140, 150 and 160 may be referred to as an ESD protection circuit for a test (TESD) to be distinguished from the ESD protection circuit 120.

In some example embodiments, three or more ESD protection circuits may be included in the semiconductor device 100. For example, the different processes for the fabrication of the semiconductor device 100 may include a wafer level process for fabricating a wafer including the semiconductor device 100, a package level process for detaching the semiconductor device 100 from the wafer to assemble the semiconductor device 100 into a semiconductor package, and a post-package level process (or a post-package level work or job) for performing a reliability test on the semiconductor package after the package level process and/or for shipping the semiconductor package to a customer to mount the semiconductor package on at least one of various electronic devices after the package level process. When the semiconductor device 100 includes the three or more ESD protection circuits (e.g., the plurality of ESD protection circuits 140, 150 and 160), one ESD protection circuit (e.g., the ESD protection circuit 140) may be used to perform an ESD test in the wafer level process, another ESD protection circuit (e.g., the ESD protection circuit 150) may be used to perform an ESD test in the package level process, and the other ESD protection circuit (e.g., the ESD protection circuit 160) may be used to perform an ESD test in the post-package level process. Accordingly, it may be efficiently checked whether an ESD failure (or a defect due to an ESD) occurs in each process, an ESD margin for each process may be efficiently determined, and an ESD level history for each process may be efficiently traced.

The plurality of test pads TP1, TP2 and TP3 are electrically connected to the plurality of ESD protection circuits 140, 150 and 160, respectively. In the test mode, the plurality of test pads TP1, TP2 and TP3 may receive test signals ETS1, ETS2 and ETS3 associated with the ESD tests and/or may output test result signals ETRS1, ETRS2 and ETRS3 associated with the ESD tests. In the normal mode, the plurality of test pads TP1, TP2 and TP3 may not receive or output signals. For example, the test pad TP1 may be electrically connected to the ESD protection circuit 140, and may receive the test signal ETS1 and/or may output the test result signal ETRS1 in the test mode.

In some example embodiments, the number of the test signals FTS1, FTS2 and FTS3 received through the signal pad SP1 and the number of the test result signals FTRS1, FTRS2, FTRS3 output from the signal pad SP1 may be substantially equal to the number of the test signals ETS1, ETS2 and ETS3 received through the plurality of test pads TP1, TP2 and TP3 and the number of the test result signals ETRS1, ETRS2 and ETRS3 output from the plurality of test pads TP1, TP2 and TP3, respectively, as will be described later.

The storage unit 130 may be electrically connected to the plurality of ESD protection circuits 140, 150 and 160, and may receive the test result signals ETRS1, ETRS2 and ETRS3 to store results of the ESD tests. As with the plurality of ESD protection circuits 140, 150 and 160, the storage unit 130 may be formed or implemented independently/individually of the functional circuit 110. For example, the storage unit 130 may include at least one of various nonvolatile memories such as an EEPROM, a flash memory, a PRAM, a RRAM, a MRAM, a FRAM, a NFGM, a PoRAM, or the like.

In some example embodiments, the ESD margin for each of the different processes for the fabrication of the semiconductor device 100 may be determined based on the results of the ESD tests stored in the storage unit 130, and/or the ESD level history for each of the different processes may be traced based on the results of the ESD tests stored in the storage unit 130.

The semiconductor device 100 according to example embodiments may include the plurality of ESD protection circuits 140, 150 and 160 that are formed independently of the functional circuit 110. The ESD test may be performed in each process using the plurality of ESD protection circuits 140, 150 and 160, and thus it may be efficiently and accurately checked whether the ESD failure (or the defect due to the ESD) occurs in each process. In addition, each of the plurality of ESD protection circuits 140, 150 and 160 may include the plurality of junctions having different sizes and capacities, and thus the ESD margin for each process may be determined based on which junction has a defect or a failure, as will be described later. Further, the semiconductor device 100 according to example embodiments may include the storage unit 130 that stores the result of the ESD test in each process, and thus the ESD level history tracing for each process may be efficiently performed.

Figure 2:
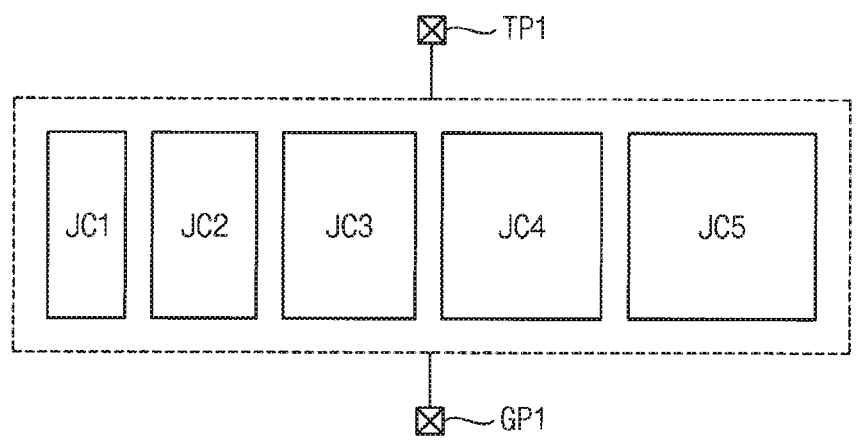
FIG. 2 is a block diagram illustrating an example of an ESD protection circuit included in a semiconductor device according to example embodiments.

FIG. 2 is a block diagram illustrating an example of an ESD protection circuit included in a semiconductor device according to example embodiments.

Referring to FIG. 2, an ESD protection circuit 140 may include a plurality of junctions JC1, JC2, JC3, JC4 and JC5 that are connected between a test pad TP1 and a ground pad GP1. Each of the plurality of junctions may have a different size and capacity.

The junction JC1 may have a first size and a first capacity. The junction JC2 may have a second size larger than the first size and a second capacity larger than the first capacity. The junction JC3 may have a third size larger than the second size and a third capacity larger than the second capacity. The junction JC4 may have a fourth size larger than the third size and a fourth capacity larger than the third capacity. The junction JC5 may have a fifth size larger than the fourth size and a fifth capacity larger than the fourth capacity. In other words, as the size of the junction increases, the capacity of the junction may increase.

Although FIG. 2 illustrates an example where one ESD protection circuit 140 includes five junctions JC1, JC2, JC3, JC4 and JC5 having different sizes and capacities, example embodiments are not limited thereto. For example, the number of junctions included in one ESD protection circuit may be changed according to example embodiments.

The capacity of each junction may represent the amount and/or magnitude of ESD events capable of being endured or withstood by each junction. For example, as the capacity of the junction increases, each junction may normally operate even if a larger amount of charge flows in each junction. When an ESD event that is greater than the capacity of the junction occurs, e.g., when an ESD event that exceeds a threshold or limited value occurs, the junction may not normally operate and a junction failure due to the ESD event may occur.

In some example embodiments, the ESD failure or the defect due to an ESD may be detected in each process for the fabrication of the semiconductor device 100 by checking whether the plurality of junctions JC1, JC2, JC3, JC4 and JC5 are defective. For example, the ESD protection circuit 140 is assumed to be used to perform the ESD test in the wafer level process, as described with reference to FIG. 1. When the junction JC1 is defective (e.g., has a defect or failure), the ESD failure may be detected such that an ESD event exceeding a first threshold value or a first limited value corresponding to the junction JC1 occurs in the wafer level process. When the junctions JC1 and JC2 are defective, the ESD failure may be detected such that an ESD event exceeding a second threshold value or a second limited value corresponding to the junction JC2 occurs in the wafer level process. In other words, it may be identified or confirmed that a process in which the ESD failure occurs is the wafer level process, and the ESD margin for the wafer level process may be determined based on which junction is defective.

In some example embodiments, structures of the plurality of junctions JC1, JC2, JC3, JC4 and JC5 may be substantially the same as each other. In other words, although the plurality of junctions JC1, JC2, JC3, JC4 and JC5 have different sizes and capacities, the plurality of junctions JC1, JC2, JC3, JC4 and JC5 may be implemented with the same structure so as not to increase the design and manufacturing complexity.

In some example embodiments, the ESD protection circuit 120 in FIG. 1 connected to the functional circuit 110 in FIG. 1 may have substantially the same size, capacity and structure as one of the plurality of junctions JC1, JC2, JC3, JC4 and JC5. For example, a structure of the ESD protection circuit 120 may be substantially the same as the structure of the junction JC3, and a size and a capacity of the ESD protection circuit 120 may be substantially the same as the third size and the third capacity of the junction JC3.

In other words, the ESD protection circuit 120 for the functional circuit that is connected to the functional circuit 110 may include only one junction (e.g., a junction for the functional circuit), and the ESD protection circuit 140 for the test that is formed independently of the functional circuit 110 may include the plurality of junctions JC1, JC2, JC3, JC4 and JC5 according to example embodiments. The plurality of junctions JC1, JC2, JC3, JC4 and JC5 may include at least one junction (e.g., the junction JC3) having substantially the same size and capacity as the junction for the functional circuit, at least one junction (e.g., the junctions JC1 and JC2) having smaller size and capacity than the junction for the functional circuit, and at least one junction (e.g., the junctions JC4 and JC5) having larger size and capacity than the junction for the functional circuit. As such, the plurality of junctions JC1, JC2, JC3, JC4 and JC5 included in the ESD protection circuit 140 for the test may include three or more junctions.

Figure 3:
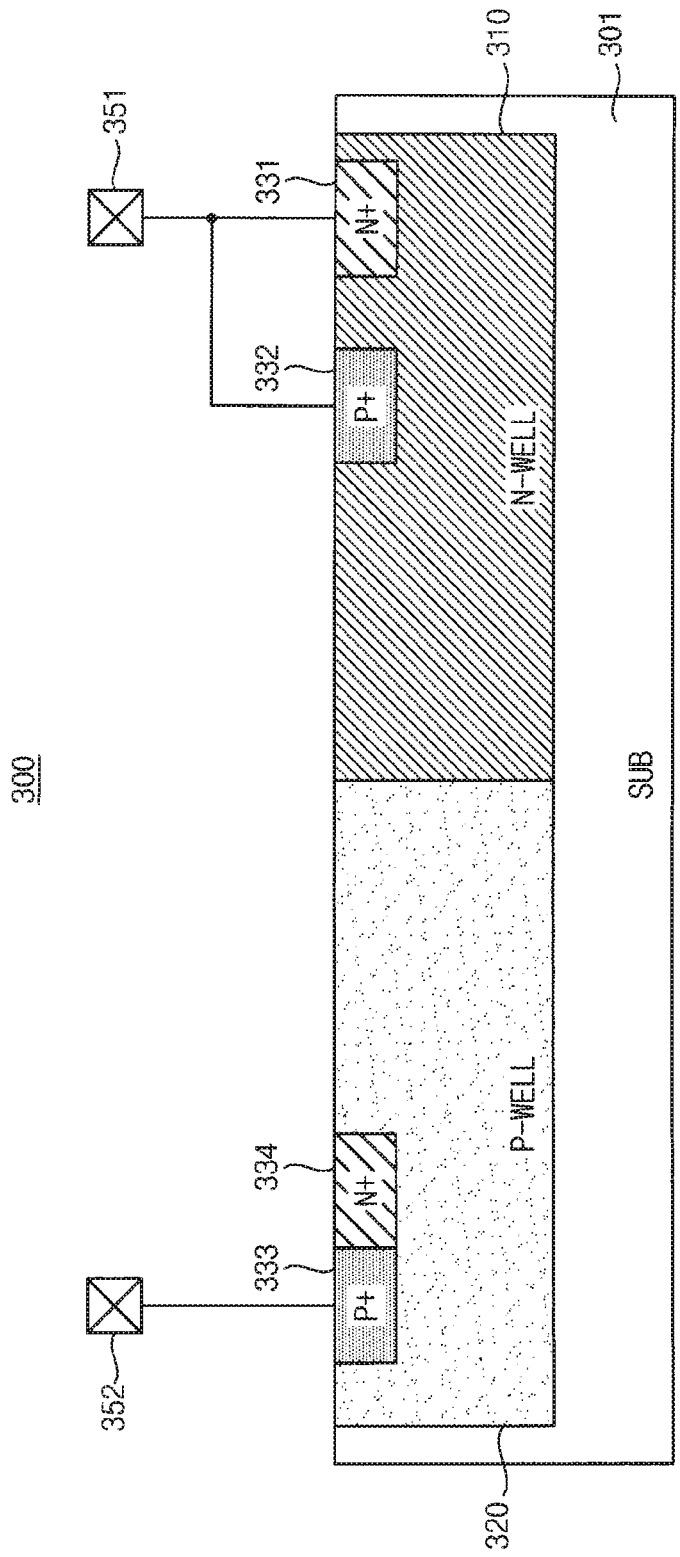
FIGS. 3, 4 and 5 are diagrams illustrating an example of a junction included in an ESD protection circuit included in a semiconductor device according to example embodiments.
Figure 4:
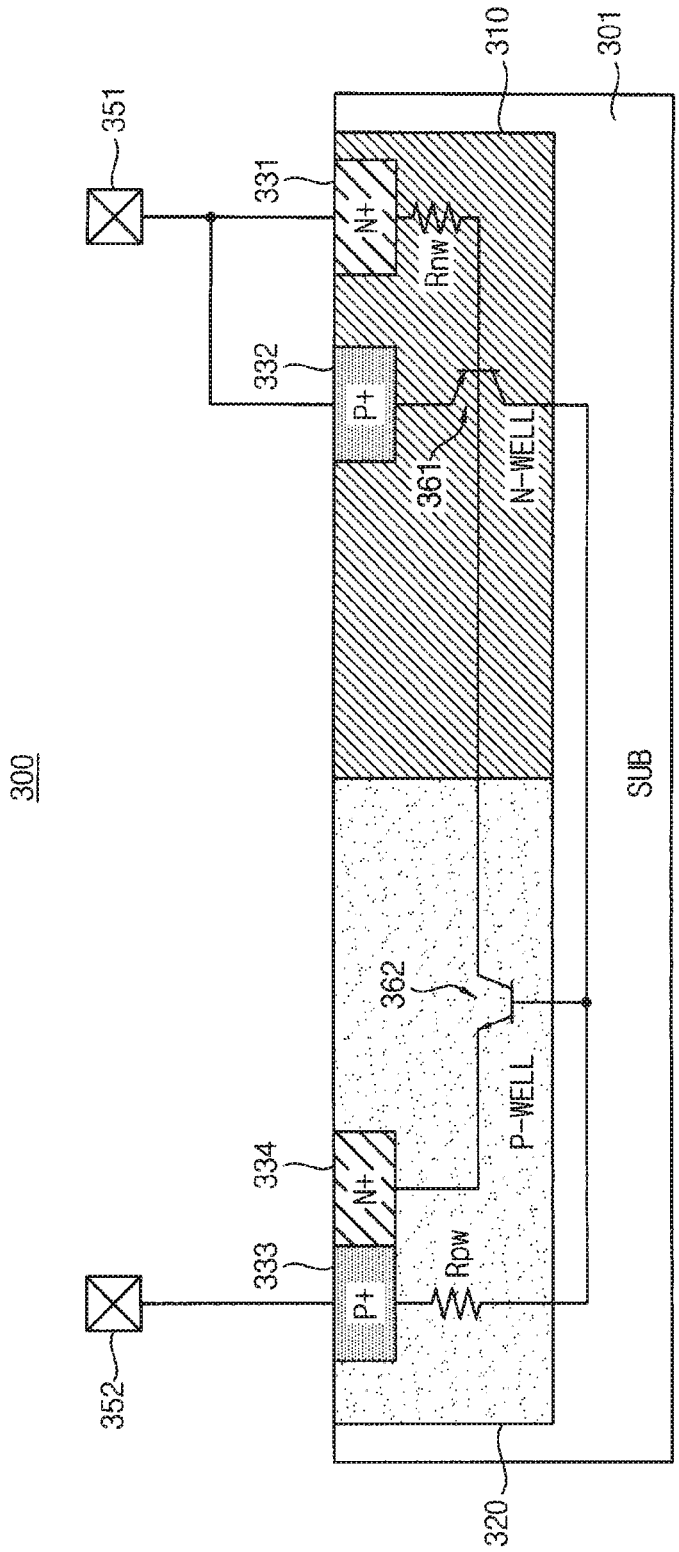
Figure 5:
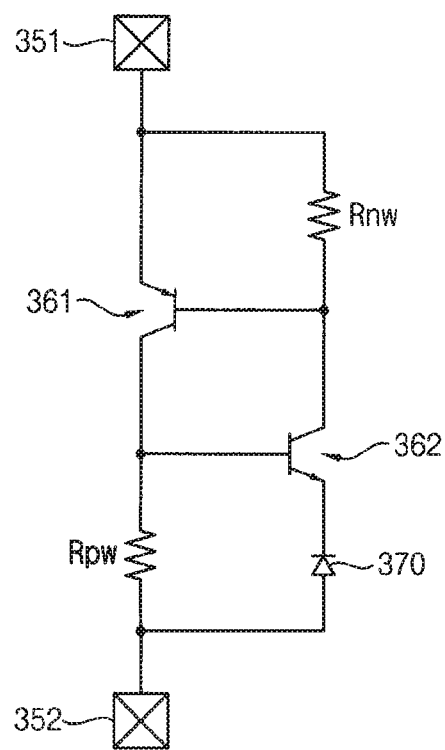

FIGS. 3, 4 and 5 are diagrams illustrating an example of a junction included in an ESD protection circuit included in a semiconductor device according to example embodiments.

FIG. 3 is a cross-sectional view of an example where the junction included in the ESD protection circuit of FIG. 2 is implemented by a silicon controlled rectifier (SCR). FIG. 4 is a diagram illustrating a bipolar junction transistor (BJT) parasitically formed in the silicon controlled rectifier of FIG. 3. FIG. 5 is a circuit diagram illustrating an equivalent circuit of the silicon controlled rectifier of FIG. 3.

Referring to FIGS. 2, 3, 4 and 5, each of the plurality of junctions JC1, JC2, JC3, JC4 and JC5 may include a silicon controlled rectifier 300.

The silicon controlled rectifier 300 may include a semiconductor substrate (SUB) 301, a first well (N-WELL) 310, a second well (P-WELL) 320, a first impurity region (N+) 331, a second impurity region (P+) 332, a third impurity region (P+) 333 and a fourth impurity region (N+) 334.

The first well 310 may be formed in the semiconductor substrate 301 and may have a first conductivity type.

The second well 320 may be formed in the semiconductor substrate 301 to contact the first well 310 and may have a second conductivity type.

In some example embodiments, the first conductivity type may be n-type, and the second conductivity type may be p-type. For example, the first well 310 may be an n-well, and the second well 320 may be a p-well.

For the following description, the first conductivity type is assumed to be n-type, and the second conductivity type is assumed to be p-type. However, example embodiments are not limited thereto.

The first impurity region 331 may be formed in the first well 310, and may be of n-type. In some example embodiments, an impurity concentration of the first impurity region 331 may be higher than an impurity concentration of the first well 310.

The second impurity region 332 may be formed in the first well 310, may be spaced apart from the first impurity region 331 in a direction of the second well 320, and may be of p-type. In some example embodiments, an impurity concentration of the second impurity region 332 may be higher than an impurity concentration of the second well 320.

The third impurity region 333 may be formed in the second well 320, and may be of p-type. In some example embodiments, an impurity concentration of the third impurity region 333 may be higher than the impurity concentration of the second well 320.

The fourth impurity region 334 may be formed in the second well 320, may be located in a direction of the first well 310 from the third impurity region 333 to contact the third impurity region 333, and may be of n-type. In some example embodiments, an impurity concentration of the fourth impurity region 334 may be higher than the impurity concentration of the first well 310.

The first impurity region 331 and the second impurity region 332 may be electrically connected to a first electrode pad 351. The third impurity region 333 may be electrically connected to a second electrode pad 352. The fourth impurity region 334 may be electrically floated.

The first electrode pad 351 and the second electrode pad 352 in FIG. 3 may correspond to the test pad TP1 and the ground pad GP1 in FIG. 2, respectively. The first electrode pad 351 may be connected to a relatively high voltage, and the second electrode pad 352 may be connected to a relatively low voltage.

As illustrated in FIG. 4, a PNP bipolar junction transistor 361 may be parasitically formed in the silicon controlled rectifier 300. An emitter of the PNP bipolar junction transistor 361 may correspond to the second impurity region 332, a base of the PNP bipolar junction transistor 361 may correspond to the first well 310, and a collector of the PNP bipolar junction transistor 361 may correspond to the second well 320 and the third impurity region 333.

In addition, an NPN bipolar junction transistor 362 may be parasitically formed in the silicon controlled rectifier 300. A collector of the NPN bipolar junction transistor 362 may correspond to the first impurity region 331 and the first well 310, a base of the NPN bipolar junction transistor 362 may correspond to the second well 320, and an emitter of the NPN bipolar junction transistor 362 may correspond to the fourth impurity region 334.

In FIG. 4, a resistance of the first well 310 is represented as an n-well resistor Rnw, and a resistance of the second well 320 is represented as a p-well resistor Rpw. Thus, an equivalent circuit of the silicon controlled rectifier 300 of FIG. 3 may be represented as a circuit diagram of FIG. 5.

As illustrated in FIG. 4, the fourth impurity region 334, which corresponds to the emitter of the NPN bipolar junction transistor 362, may not be electrically connected to the second electrode pad 352 directly but, rather, may be electrically connected to the second electrode pad 352 through the third impurity region 333, which contacts the fourth impurity region 334. The third impurity region 333 of p-type and the fourth impurity region 334 of n-type, which contact each other, may operate as a diode. As a result, as illustrated in FIG. 5, the equivalent circuit of the silicon controlled rectifier 300 of FIG. 3 may include a diode 370 connected between the emitter of the NPN bipolar junction transistor 362 and the second electrode pad 352.

Although an example of the silicon controlled rectifier 300 is described with reference to FIGS. 3, 4 and 5, example embodiments are not limited thereto, and a structure of the silicon controlled rectifier may be changed according to example embodiments. For example, the silicon controlled rectifier may further include a fifth impurity region, a sixth impurity region, and a gate in addition to elements of the silicon controlled rectifier 300 of FIG. 3. The fifth impurity region may be formed in the second well 320, may be spaced apart from the fourth impurity region 334 in a direction of the first well 310, and may be of p-type. The sixth impurity region may be formed at a boundary region between the first well 310 and the second well 320, may be spaced apart from the second impurity region 332 and the fifth impurity region 335, and may be of p-type. The gate may be formed above the semiconductor substrate 301 between the second impurity region 332 and the sixth impurity region 336, and may be electrically connected to the first electrode pad 351. As another example, the structure of the silicon controlled rectifier 300 of FIG. 3 may be changed such that the second impurity region 332 is located to contact the first impurity region 331 and is electrically floated and the fourth impurity region 334 is spaced apart from the third impurity region 333 and is electrically connected to the second electrode pad 352. For still another example, the conductivity types of all the regions may be reversely formed in the above-described examples.

In addition, although the silicon controlled rectifier 300 is described as an example of the junction with reference to FIGS. 3, 4 and 5, example embodiments are not limited thereto. For example, each junction may be implemented with one of various ESD protection circuits.

Figure 6:
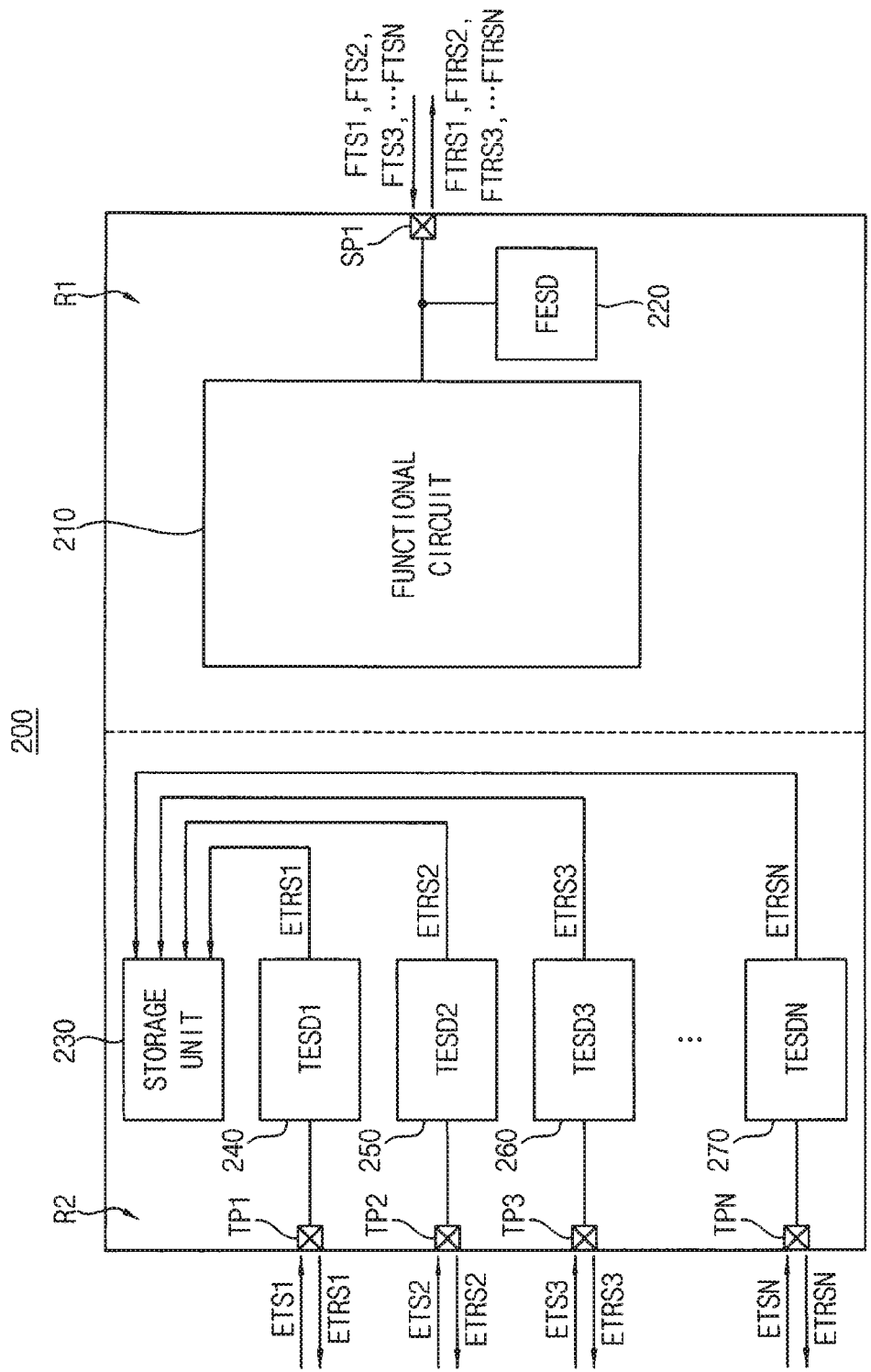
FIG. 6 is a block diagram illustrating a semiconductor device according to example embodiments.

FIG. 6 is a block diagram illustrating a semiconductor device according to example embodiments. The descriptions repeated with FIG. 1 will be omitted.

Referring to FIG. 6, a semiconductor device 200 includes a functional circuit 210, a plurality of ESD protection circuits (TESD1, TESD2, TESD3, . . . , TESDN) 240, 250, 260, . . . , 270, and a plurality of test pads TP1, TP2, TP3, . . . , TPN. The semiconductor device 200 may further include an ESD protection circuit 220, a signal pad SP1, and a storage unit 230.

The semiconductor device 200 of FIG. 6 may be substantially the same as the semiconductor device 100 of FIG. 1, except that the semiconductor device 200 includes a larger number of ESD protection circuits 240, 250, 260, . . . , 270 and a larger number of test pads TP1, TP2, TP3, . . . , TPN. The functional circuit 210, the ESD protection circuit 220, the signal pad SP1 and the storage unit 230 in FIG. 6 may be substantially the same as the functional circuit 110, the ESD protection circuit 120, the signal pad SP1 and the storage unit 130 in FIG. 1, respectively.

Each of the plurality of ESD protection circuits 240, 250, 260, . . . , 270 is used to perform an ESD test in different processes of fabricating the semiconductor device 200. The plurality of test pads TP1, TP2, TP3, . . . , TPN may receive test signals ETS1, ETS2, ETS3, . . . , ETSN associated with the ESD tests and/or may output test result signals ETRS1, ETRS2, ETRS3, . . . , ETRSN associated with the ESD tests.

Although an example where each of the ESD protection circuits 140, 150 and 160 is used to perform a single ESD test in a respective one of the wafer level process, as described above with reference to FIG. 1, example embodiments are not limited thereto and two or more ESD tests may be performed in at least one of the wafer level process, the package level process and the post package level process. The semiconductor device 200 of FIG. 6 may include N ESD protection circuits 240, 250, 260, . . . , 270 and N test pads TP1, TP2, TP3, . . . , TPN connected thereto, where N is a natural number greater than or equal to four, such that each ESD test is to be performed by a different ESD protection circuit.

The signal pad SP1 may receive the same number of test signals FTS1, FTS2, FTS3, . . . , FTSN as the test signals ETS1, ETS2, ETS3, . . . , ETSN, and may output the same number of test result signals FTRS1, FTRS2, FTRS3, . . . , FTRSN as the test result signals ETRS1, ETRS2, ETRS3, . . . , ETRSN.

Although examples where each of the functional circuits 110 and 210 is connected to one signal pad, and the reception of the test signal and the output of the test result signal are performed through the same signal pad are described with reference to FIGS. 1 and 6, example embodiments are not limited thereto. For example, the number of signal pads connected to the functional circuit may be changed, and one ESD protection circuit for the functional circuit may be connected to each signal pad. In addition, a signal pad for receiving the test signal and a signal pad for outputting the test result signal may be separated or distinguished from each other.

Similarly, although examples where each of the ESD protection circuits for the test 140~160 and 240~270 formed independently of the functional circuits 110 and 210 is connected to one test pad, and reception of the test signal and the output of the test result signal are performed through the same test pad are described with reference to FIGS. 1 and 6, example embodiments are not limited thereto. For example, the number of test pads connected to each ESD protection circuit for the test may be changed. In addition, a test pad for receiving the test signal and a test pad for outputting the test result signal may be separated or distinguished from each other.

Figure 7:
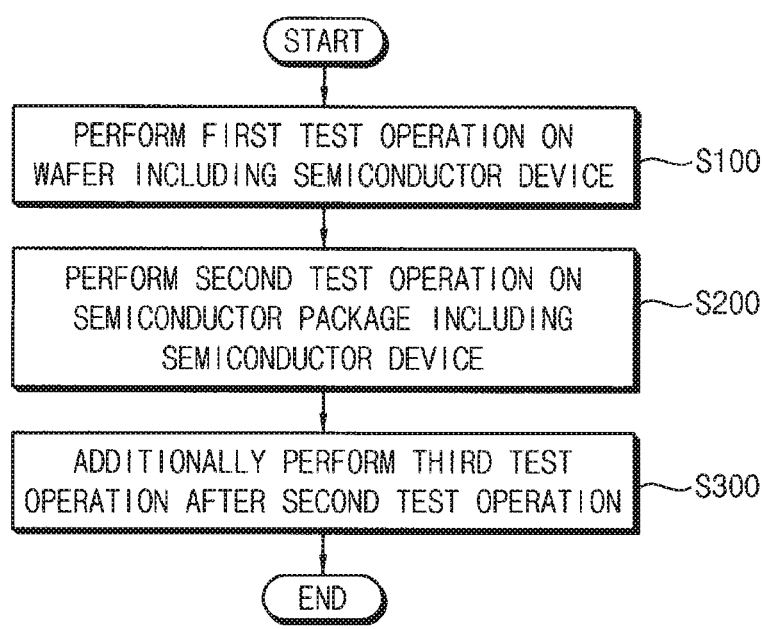
FIG. 7 is a flowchart illustrating a method of testing a semiconductor device according to example embodiments.

FIG. 7 is a flowchart illustrating a method of testing a semiconductor device according to example embodiments.

Referring to FIG. 7, in a method of testing a semiconductor device according to example embodiments, the semiconductor device to be tested may be the semiconductor device described with reference to FIGS. 1 through 5. For example, the semiconductor device (e.g., the semiconductor device 100) includes a functional circuit (e.g., the functional circuit 110) and a plurality of ESD protection circuits (e.g., the ESD protection circuits 140, 150 and 160) formed independently of the functional circuit. Each of the plurality of ESD protection circuits includes a plurality of junctions (e.g., the junctions JC1, JC2, JC3, JC4 and JC5) having different sizes and capacities.

A first test operation is performed on a wafer including the semiconductor device using the functional circuit and a first ESD protection circuit (e.g., the ESD protection circuit 140) among the plurality of ESD protection circuits included in the semiconductor device (step S100). The first test operation may be a wafer level test that is performed on the wafer including the semiconductor device before the semiconductor device is detached from the wafer. The first test operation may include a functional test for the functional circuit and an ESD test for the first ESD protection circuit, as will be described with reference to FIG. 10.

A second test operation is performed on a semiconductor package including the semiconductor device using the functional circuit and a second ESD protection circuit (e.g., the ESD protection circuit 150) among the plurality of ESD protection circuits included in the semiconductor device (step S200). The second test operation may be a package level test that is performed on the semiconductor package including the semiconductor device after the semiconductor device is detached from the wafer and assembled into the semiconductor package. The second test operation may include a functional test for the functional circuit and an ESD test for the second ESD protection circuit, as will be described with reference to FIG. 11.

After the second test operation, a third test operation for the semiconductor device is selectively further performed using the functional circuit and a third ESD protection circuit (e.g., the ESD protection circuit 160) among the plurality of ESD protection circuits included in the semiconductor device (step S300). In other words, the semiconductor device may further include the third ESD protection circuit, which is an extra ESD protection circuit, such that the third test operation may be additionally performed after the second test operation. The third test operation may be a post-package level test that is additionally performed after the package level test. The third test operation may include a functional test for the functional circuit and an ESD test for the third ESD protection circuit, as will be described with reference to FIG. 12.

In the method of testing the semiconductor device according to example embodiments, the ESD test may be performed in each process using the plurality of ESD protection circuits that are included in the semiconductor device and formed independently of the functional circuit, and thus it may be efficiently and accurately checked whether the ESD failure (or the defect due to the ESD) occurs in each process. In addition, the third test operation may be additionally and selectively performed after the second test operation using the extra ESD protection circuit, and thus the ESD level history tracing for each process may be efficiently performed.

Figure 8:
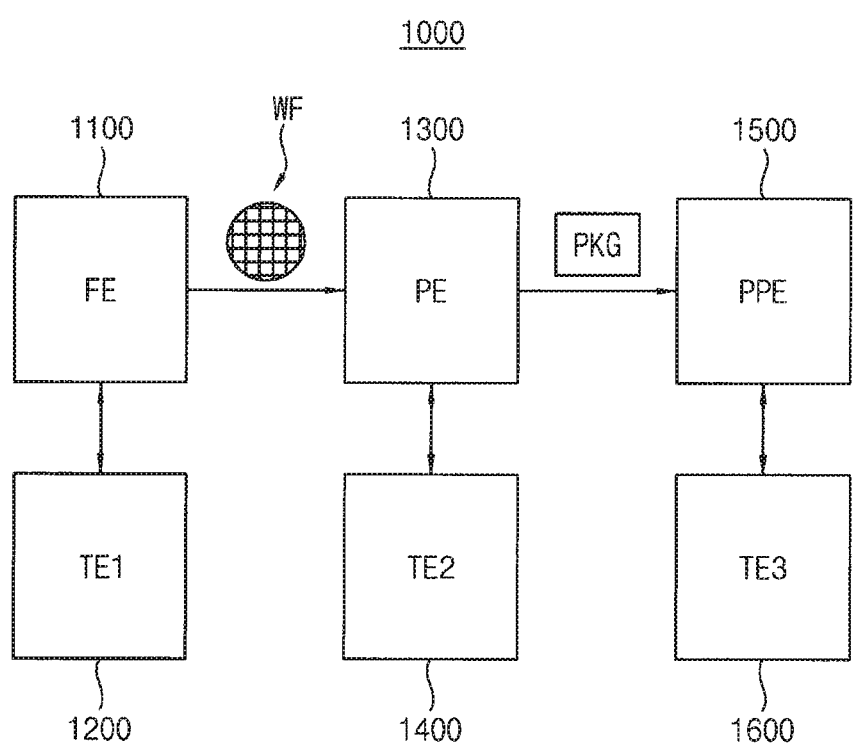
FIG. 8 is a block diagram illustrating a manufacturing/testing system for a semiconductor device according to example embodiments.

FIG. 8 is a block diagram illustrating a manufacturing/testing system for a semiconductor device according to example embodiments.

Referring to FIG. 8, a manufacturing/testing system 1000 for a semiconductor device includes a wafer fabrication equipment (FE) 1100, a package assembly equipment (PE) 1300, a post-package process equipment (PPE) 1500, and a plurality of test equipment (TE1, TE2 and TE3) 1200, 1400 and 1600.

The wafer fabrication equipment 1100 performs or executes wafer level processes to fabricate a wafer WF including a semiconductor device according to example embodiments. For example, the wafer level processes may include an epitaxial process, an oxidation process, a photolithography process, an etching process, a deposition process, an ion implantation process, a metal wiring process, or the like.

The package assembly equipment 1300 performs or executes package level processes to detach the semiconductor device from the wafer WF to assemble the semiconductor device into a semiconductor package PKG. For example, the package level processes may include a wafer sawing process, a wire bonding process, a molding process, a ball (or solder ball) attaching process, or the like.

The wafer fabrication equipment 1100 and the package assembly equipment 1300 may be controlled, managed and/or supervised by a manufacturer who manufactures the semiconductor device.

The post-package process equipment 1500 performs or executes post-package level processes (or post-package level works or jobs) that are further performed after the semiconductor package PKG is completely assembled and fabricated.

In some example embodiments, the post-package process equipment 1500 may include reliability test equipment that performs or executes reliability tests for the semiconductor package PKG, and the post-package level processes may include the reliability tests. For example, the reliability tests may include a temperature cycling (T/C) test, a high temperature storage (HTS) test, a temperature & humidity (T&H) test, a highly accelerated temperature & humidity stress test (HAST), or the like. The reliability test equipment may be controlled, managed and/or supervised by the manufacturer or an external vendor.

In other example embodiments, the post-package process equipment 1500 may include set assembly equipment (or complete or finished product assembly equipment) for mounting the semiconductor package PKG on an electronic device (e.g., a set, complete product or finished product), and the post-package level processes may include the set assembly processes. For example, the electronic device may be a computing and/or mobile device such as a personal computer (PC), a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc. The set assembly equipment may be controlled, managed and/or supervised by a customer who purchases the semiconductor package PKG and manufactures the electronic device.

The test equipment 1200 performs or executes a first test operation on the wafer WF including the semiconductor device using the functional circuit and the first ESD protection circuit included in the semiconductor device. The test equipment 1400 performs or executes a second test operation on the semiconductor package PKG including the semiconductor device using the functional circuit and the second ESD protection circuit included in the semiconductor device. The test equipment 1600 further performs or executes a third test operation for the semiconductor device using the functional circuit and the third ESD protection circuit included in the semiconductor device. In other words, the test equipment 1200, 1400 and 1600 may perform step S100, S200 and S300 in FIG. 7, respectively.

Figure 9:
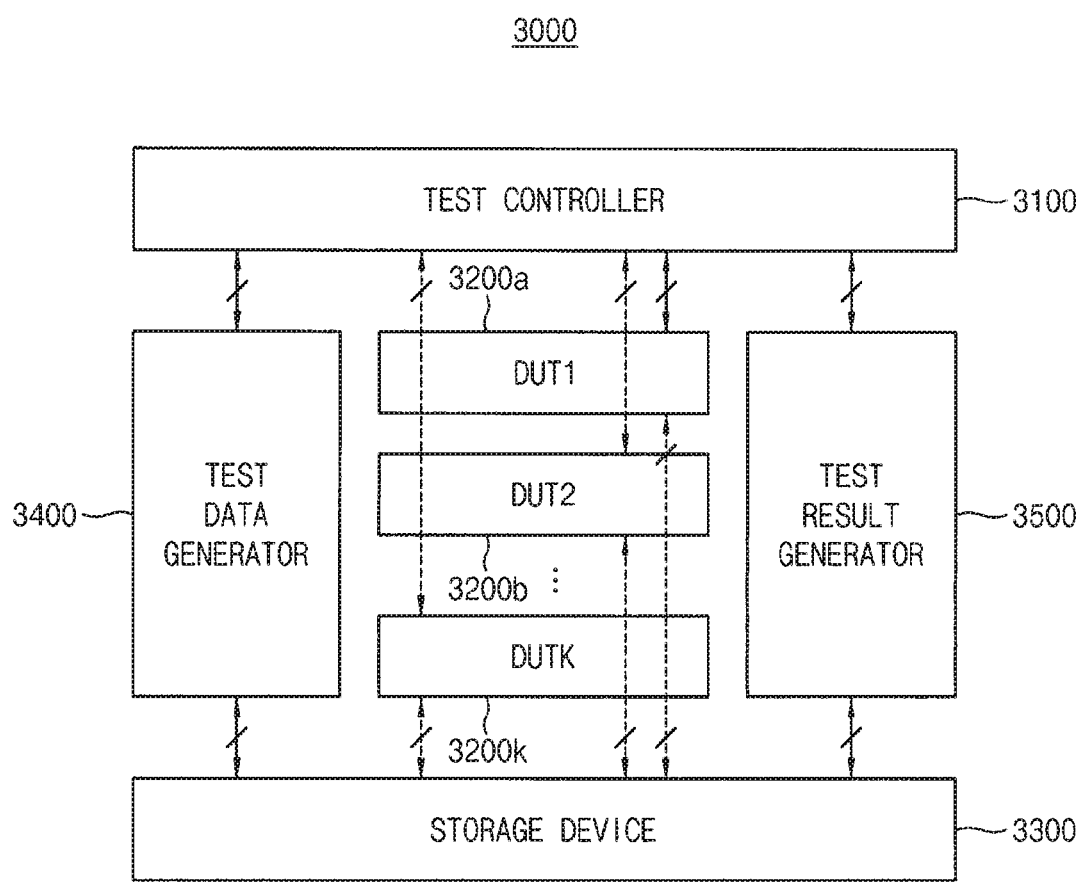
FIG. 9 is a block diagram illustrating an example of a test equipment included in a manufacturing/testing system for a semiconductor device according to example embodiments.

FIG. 9 is a block diagram illustrating an example of a test equipment included in a manufacturing/testing system for a semiconductor device according to example embodiments.

Referring to FIG. 9, a test equipment 3000 may include a test controller 3100, a plurality of devices under test (DUT1, DUT2, . . . , DUTK) 3200a, 3200b, . . . , 3200k, a storage device 3300, a test data generator 3400 and a test result generator 3500.

When the test equipment 3000 is the test equipment 1200 in FIG. 8, each of the plurality of devices under test 3200a-3200k in FIG. 9 may be the wafer WF in FIG. 8. When the test equipment 3000 is the test equipment 1400 in FIG. 8, each of the plurality of devices under test 3200a-3200k in FIG. 9 may be the semiconductor package PKG in FIG. 8. When the test equipment 3000 is the test equipment 1600 in FIG. 8, each of the plurality of devices under test 3200a-3200k in FIG. 9 may be the semiconductor package PKG in FIG. 8 or the electronic device on which the semiconductor package PKG is mounted.

The test controller 3100 may control a test for each of the plurality of devices under test 3200a-3200k by controlling elements included in the test equipment 3000. The storage device 3300 may store data for the test. The test data generator 3400 may generate a test signal to provide the test signal to the plurality of devices under test 3200a-3200k. The test result generator 3500 may receive a test result signal from the plurality of devices under test 3200a-3200k to determine whether or not each of the plurality of devices under test 3200a-3200k is defective.

Figure 10:
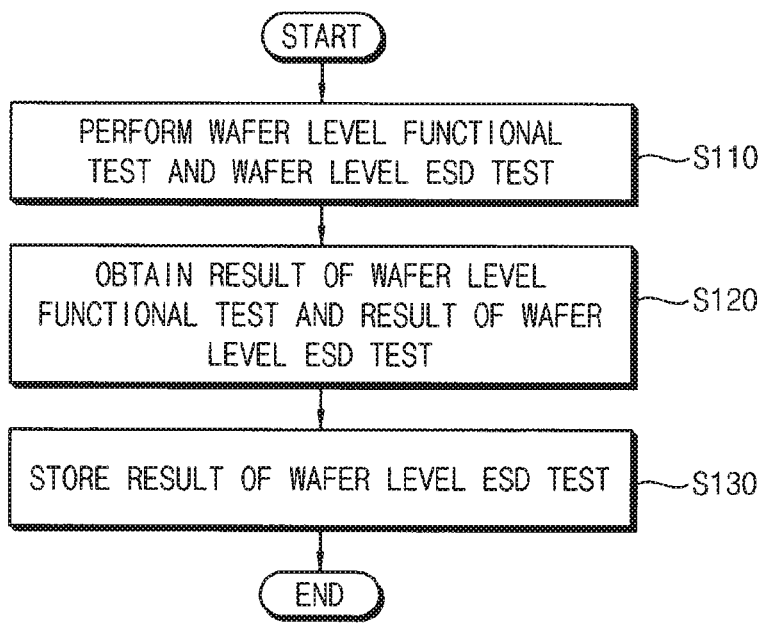
FIG. 10 is a flowchart illustrating an example of performing a first test operation in FIG. 7.

FIG. 10 is a flowchart illustrating an example of performing a first test operation in FIG. 7.

Referring to FIGS. 1, 7 and 10, when performing the first test operation (step S100), a wafer level functional test for the functional circuit 110 included in the semiconductor device 100 and a wafer level ESD test using the first ESD protection circuit 140 among the plurality of ESD protection circuits 140, 150 and 160 may be performed (step S110). For example, the wafer level functional test may be performed by applying the first functional test signal FTS1 to the functional circuit 110 through the signal pad SP1, and the wafer level ESD test may be performed by applying the first ESD test signal ETS1 to the first ESD protection circuit 140 through the first test pad TP1.

In some example embodiments, the wafer level functional test and the wafer level ESD test may be substantially simultaneously or concurrently performed by the same test equipment. For example, the test equipment 1200 in FIG. 8 may generate the first functional test signal FTS1 and the first ESD test signal ETS1, and may substantially simultaneously or concurrently provide the first functional test signal FTS1 and the first ESD test signal ETS1 to the wafer WF including the semiconductor device 100.

A result of the wafer level functional test and a result of the wafer level ESD test may be obtained (step S120). For example, the first functional test result signal FTRS1 indicating the result of the wafer level functional test may be output through the signal pad SP1, and the first ESD test result signal ETRS1 indicating the result of the wafer level ESD test may be output through the first test pad TP1. For example, the first functional test result signal FTRS1 and the first ESD test result signal ETRS1 may be provided to the test equipment 1200 in FIG. 8.

The result of the wafer level functional test may represent whether the functional circuit 110 normally operates. The result of the wafer level ESD test may represent whether the ESD failure occurs and which junction among the plurality of junctions included in the first ESD protection circuit 140 has a defect or a failure if the ESD failure occurs.

The result of the wafer level ESD test may be stored (step S130). For example, the storage unit 130 may store the result of the wafer level ESD test based on the first ESD test result signal ETRS1.

In some example embodiments, a first ESD margin for the wafer level process may be determined based on the stored result of the wafer level ESD test, as will be described with reference to FIG. 16.

In some example embodiments, the result of the wafer level functional test and the result of the wafer level ESD test may be independent of each other. For example, because the first ESD protection circuit 140 is not required for a normal operation of the semiconductor device 100, the semiconductor device 100 may be handled as a normal product without being scrapped when the functional circuit 110 is normal as the result of the wafer level function test even if an ESD failure occurs as the result of the wafer level ESD test. As another example, when the functional circuit 110 is abnormal as the result of the wafer level function test, the result of the wafer level ESD test may be stored regardless of the result of the wafer level function test, and the ESD margin determination and the ESD level history tracing may be performed based on the stored result of the wafer level ESD test.

Figure 11:
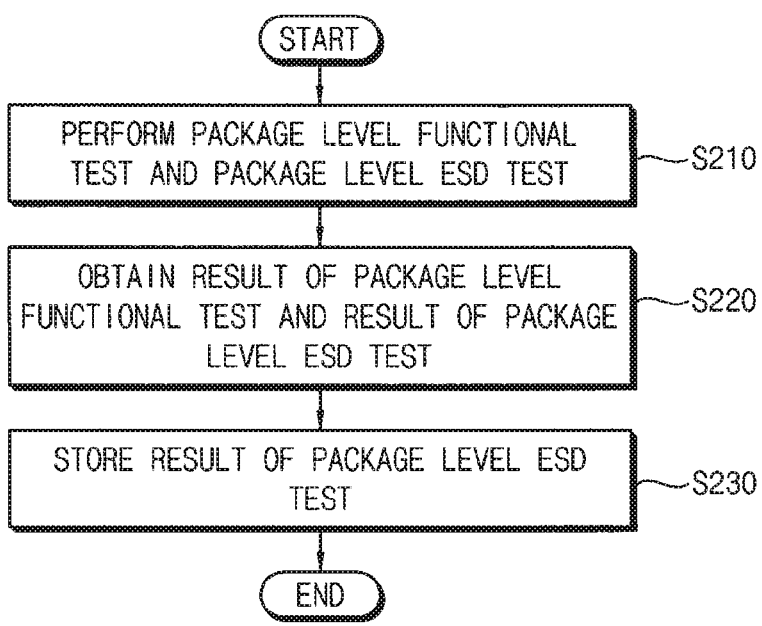
FIG. 11 is a flowchart illustrating an example of performing a second test operation in FIG. 7.

FIG. 11 is a flowchart illustrating an example of performing a second test operation in FIG. 7.

Referring to FIGS. 1, 7 and 11, when performing the second test operation (step S200), a package level functional test for the functional circuit 110 included in the semiconductor device 100 and a package level ESD test using the second ESD protection circuit 150 among the plurality of ESD protection circuits 140, 150 and 160 may be performed (step S210). A result of the package level functional test and a result of the package level ESD test may be obtained (step S220). The result of the package level ESD test may be stored (step S230).

Steps S210, S220 and S230 in FIG. 11 may be similar to steps S110, S120 and S130 in FIG. 10, respectively. For example, the package level functional test may be performed by applying the second functional test signal FTS2 to the functional circuit 110 through the signal pad SP1, and the package level ESD test may be performed by applying the second ESD test signal ETS2 to the second ESD protection circuit 150 through the second test pad TP2. The second functional test result signal FTRS2 indicating the result of the package level functional test may be output through the signal pad SP1, and the second ESD test result signal ETRS2 indicating the result of the package level ESD test may be output through the second test pad TP2. The test equipment 1400 in FIG. 8 may generate the test signals FTS2 and the ETS2, and may receive the test result signals FTRS2 and ETRS2. The storage unit 130 may store the result of the package level ESD test based on the second ESD test result signal ETRS2.

In some example embodiments, a second ESD margin for the package level process may be determined based on the stored result of the package level ESD test. In some example embodiments, the result of the package level functional test and the result of the package level ESD test may be independent of each other.

Figure 12:
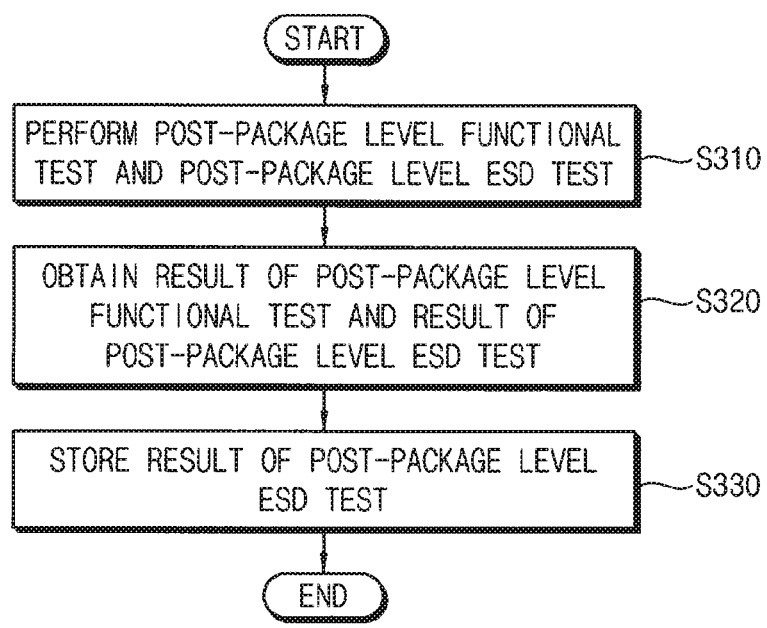
FIG. 12 is a flowchart illustrating an example of performing a third test operation in FIG. 7.

FIG. 12 is a flowchart illustrating an example of performing a third test operation in FIG. 7.

Referring to FIGS. 1, 7 and 12, when performing the third test operation (step S300), a post-package level functional test for the functional circuit 110 included in the semiconductor device 100 and a post-package level ESD test using the third ESD protection circuit 160 among the plurality of ESD protection circuits 140, 150 and 160 may be performed (step S310). A result of the post-package level functional test and a result of the post-package level ESD test may be obtained (step S320). The result of the post-package level ESD test may be stored (step S330). The post-package level ESD test may include at least one of a reliability ESD test and a set level ESD test.

Steps S310, S320 and S330 in FIG. 12 may also be similar to steps S110, S120 and S130 in FIG. 10, respectively. For example, the post-package level functional test may be performed by applying the third functional test signal FTS3 to the functional circuit 110 through the signal pad SP1, and the post-package level ESD test may be performed by applying the third ESD test signal ETS3 to the third ESD protection circuit 160 through the third test pad TP3. The third functional test result signal FTRS3 indicating the result of the post-package level functional test may be output through the signal pad SP1, and the third ESD test result signal ETRS3 indicating the result of the post-package level ESD test may be output through the third test pad TP3. The test equipment 1600 in FIG. 8 may generate the test signals FTS3 and the ETS3, and may receive the test result signals FTRS3 and ETRS3. The storage unit 130 may store the result of the post-package level ESD test based on the third ESD test result signal ETRS3.

In some example embodiments, a third ESD margin for the post-package level process may be determined based on the stored result of the post-package level ESD test. In some example embodiments, the result of the post-package level functional test and the result of the post-package level ESD test may be independent of each other.

As described above, the functional test and the ESD test may be substantially simultaneously or concurrently performed in each test operation. Thus, the total number of the test operations, the total number of the functional tests and the total number of the ESD tests may be substantially equal to each other. The total number of the functional tests may correspond to the number of the test signals FTS1, FTS2 and FTS3 and the number of the test result signals FTRS1, FTRS2 and FTRS3. The total number of the ESD tests may correspond to the number of the test signals ETS1, ETS2 and ETS3, the number of the test result signals ETRS1, ETRS2 and ETRS3 and the number of the ESD protection circuits 140, 150 and 160. Thus, the number of the test signals FTS1, FTS2 and FTS3, the number of the test result signals FTRS1, FTRS2 and FTRS3, the number of the test signals ETS1, ETS2 and ETS3, the number of the test result signals ETRS1, ETRS2 and ETRS3 and the number of the ESD protection circuits 140, 150 and 160 may be substantially equal to each other. In addition, the functional test and the ESD test may be performed independently of each other in each test operation.

Figure 13:
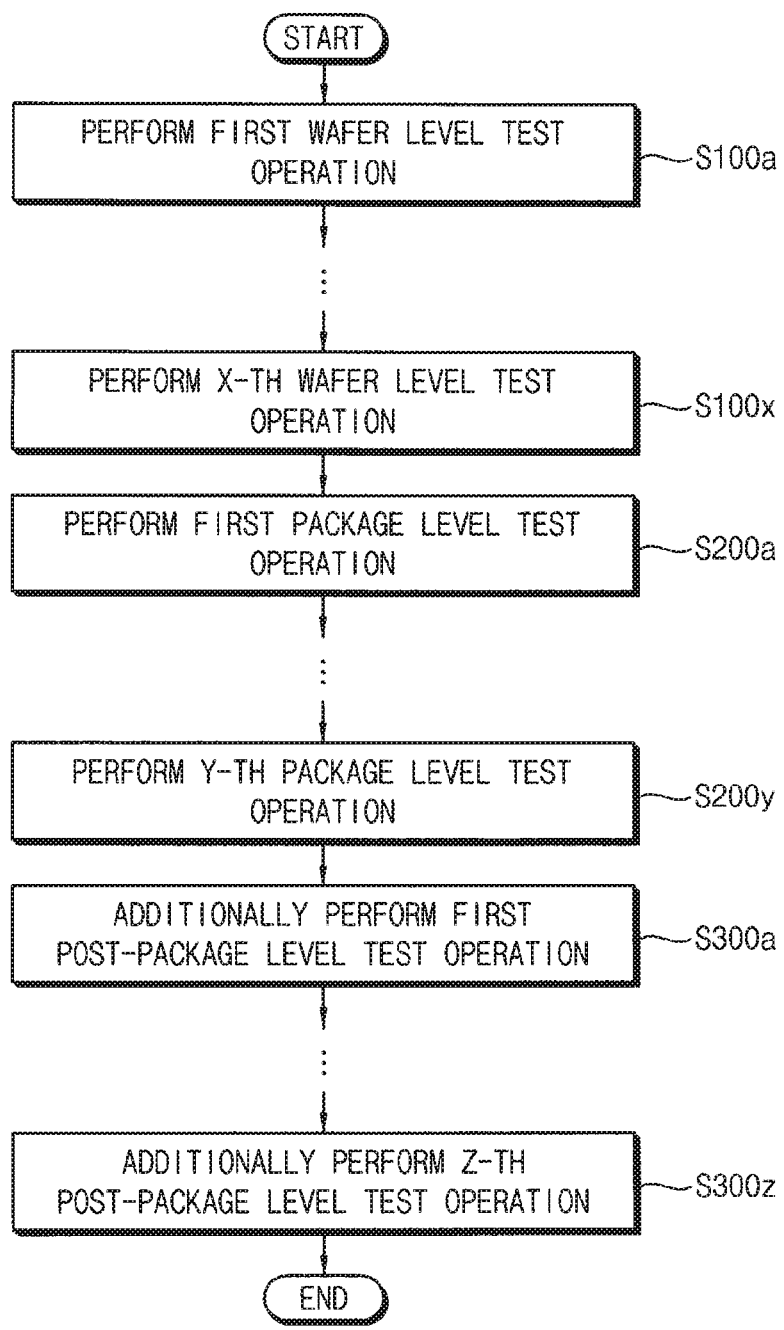
FIG. 13 is a flowchart illustrating a method of testing a semiconductor device according to example embodiments.

FIG. 13 is a flowchart illustrating a method of testing a semiconductor device according to example embodiments. The descriptions repeated with FIG. 7 will be omitted.

Referring to FIGS. 6 and 13, in a method of testing a semiconductor device according to example embodiments, the semiconductor device to be tested may be the semiconductor device described with reference to FIG. 6. For example, the semiconductor device (e.g., the semiconductor device 200) includes a functional circuit (e.g., the functional circuit 210) and a plurality of ESD protection circuits (e.g., the ESD protection circuits 240, 250, 260 and 270) formed independently of the functional circuit. Each of the plurality of ESD protection circuits includes a plurality of junctions (e.g., the junctions JC1, JC2, JC3, JC4 and JC5) having different sizes and capacities.

According to an example embodiment, as illustrated in FIG. 13 and in contrast to FIG. 7, X wafer level tests, Y package level tests and Z post-package level tests may be performed, where each of X, Y and Z is a natural number greater than or equal to two.

For example, a first wafer level test operation is performed on a wafer including the semiconductor device (step S100a), and an X-th wafer level test operation is performed on the wafer including the semiconductor device (step S100x). A first package level test operation is performed on a semiconductor package including the semiconductor device (step S200a), and a Y-th wafer level test operation is performed on the semiconductor package including the semiconductor device (step S200y). A first post-package level test operation is additionally performed for the semiconductor device (step S300a), and a Z-th post-package level test operation is additionally performed for the semiconductor device (step S300z) after the Y package level test operations. As described above, each test operation may include a functional test and an ESD test.

In the method of testing the semiconductor device according to example embodiments, the ESD test may be performed multiple times in each process using the plurality of ESD protection circuits that are included in the semiconductor device and formed independently of the functional circuit, and thus it may be efficiently and accurately checked whether the ESD failure (or the defect due to the ESD) occurs in each process.

Figure 14:
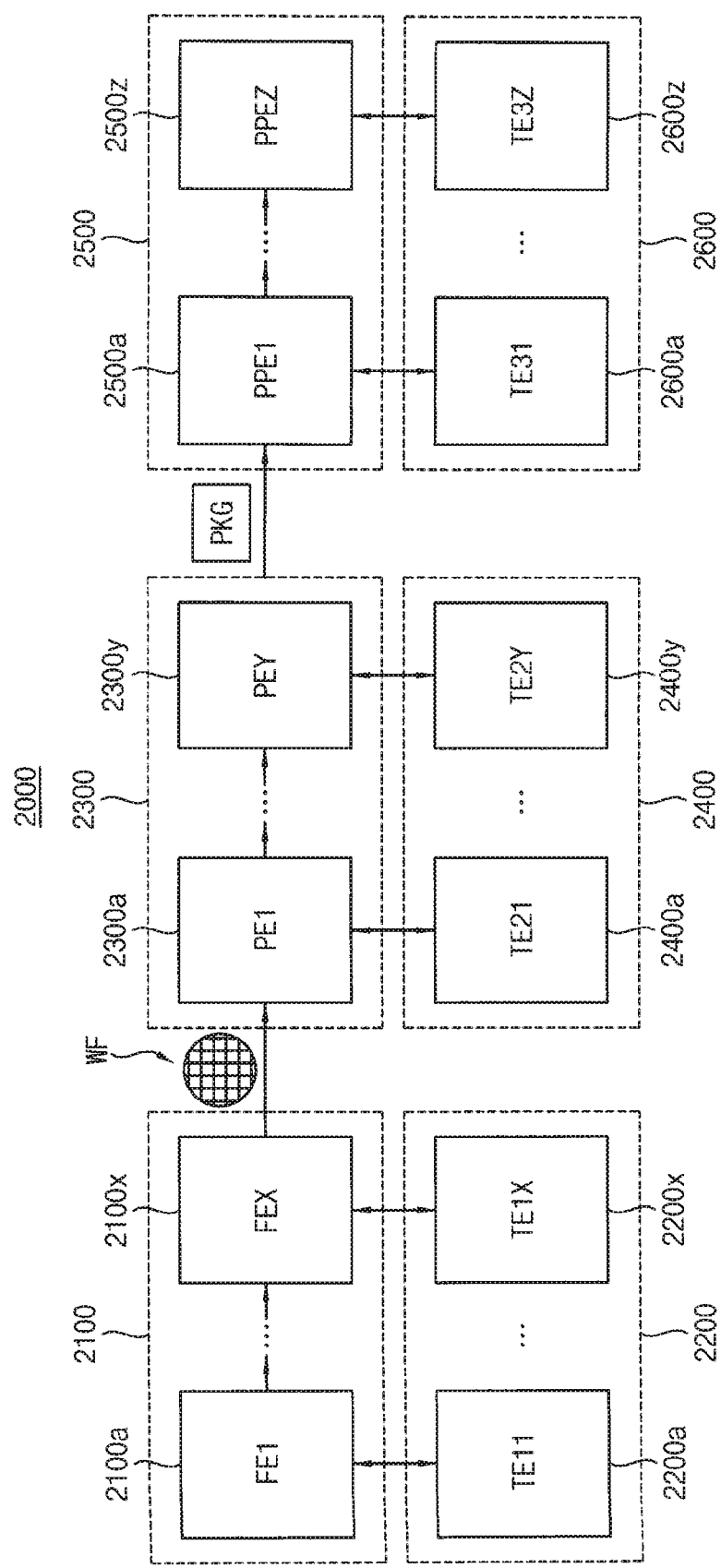
FIG. 14 is a block diagram illustrating a manufacturing/testing system for a semiconductor device according to example embodiments.

FIG. 14 is a block diagram illustrating a manufacturing/testing system for a semiconductor device according to example embodiments. The descriptions repeated with FIG. 8 will be omitted.

Referring to FIG. 14, a manufacturing/testing system 2000 for a semiconductor device includes a plurality of wafer fabrication equipment 2100, a plurality of package assembly equipment 2300, a plurality of post-package process equipment 2500, and a plurality of test equipment 2200, 2400 and 2600.

The manufacturing/testing system 2000 of FIG. 14 may be substantially the same as the manufacturing/testing system 1000 of FIG. 8, except that a plurality of equipment is included in the manufacturing/testing system 2000. First through X-th wafer fabrication equipment (FE1, . . . , FEX) 2100a, . . . , 2100x, first through Y-th package assembly equipment (PE1, . . . , PEY) 2300a, . . . , 2300y and first through Z-th post-package process equipment (PPE1, . . . , PPEZ) 2500a, . . . , 2500z in FIG. 14 may correspond to the wafer fabrication equipment 1100, the package assembly equipment 1300 and the post-package process equipment 1500 in FIG. 8, respectively. X test equipment (TE11, . . . , TE1X) 2200a, . . . , 2200x, Y test equipment (TE21, . . . , TE2Y) 2400a, . . . , 2400y and Z test equipment (TE31, . . . , TE3Z) 2600a, . . . , 2600z in FIG. 14 may correspond to the test equipment 1200, 1400 and 1600 in FIG. 8, respectively, and may perform steps S100a-S100x, S200a-S200y and S300a-S300z in FIG. 13, respectively.

Figure 15:
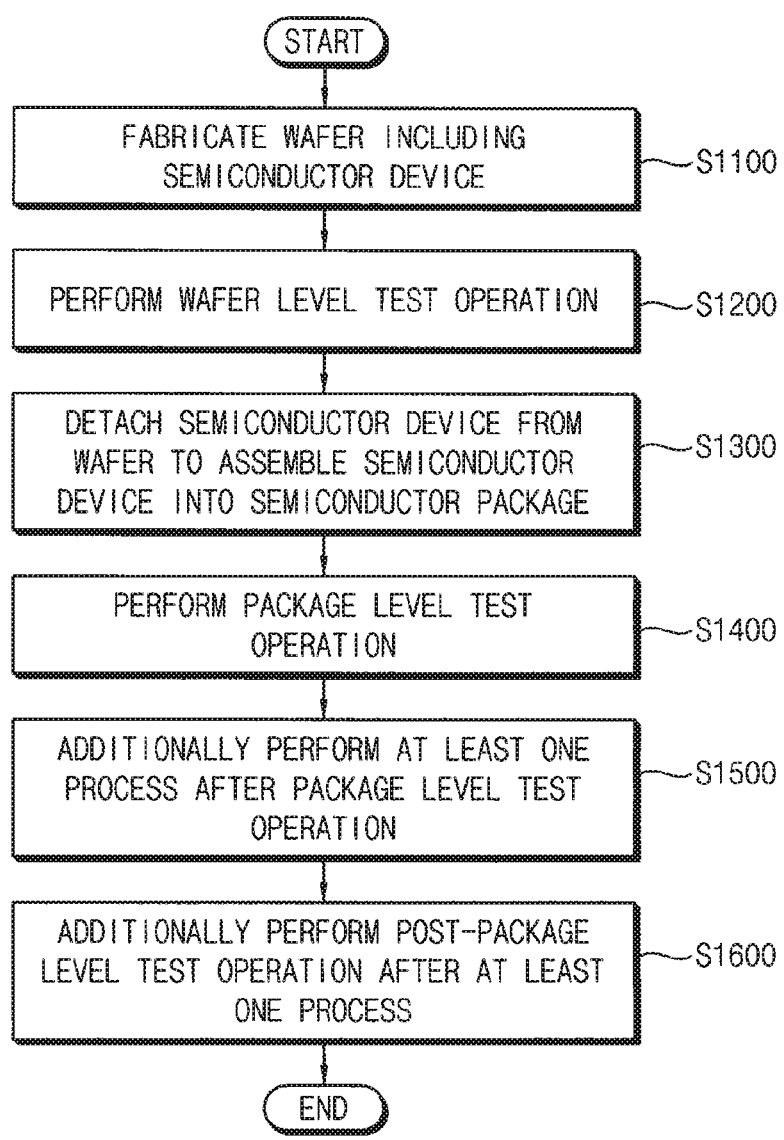
FIGS. 15, 16 and 17 are flowcharts illustrating a method of manufacturing a semiconductor device according to example embodiments.
Figure 16:
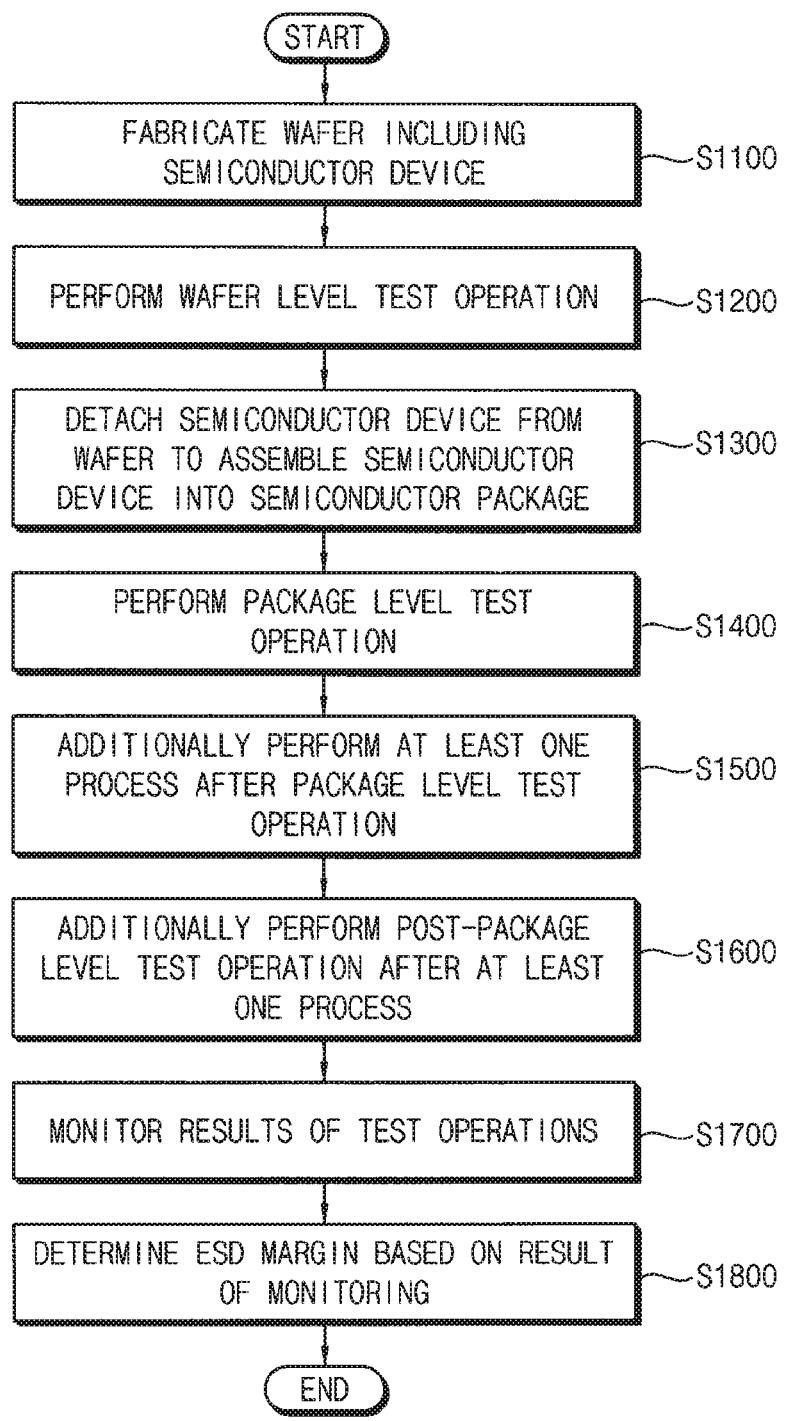
Figure 17:
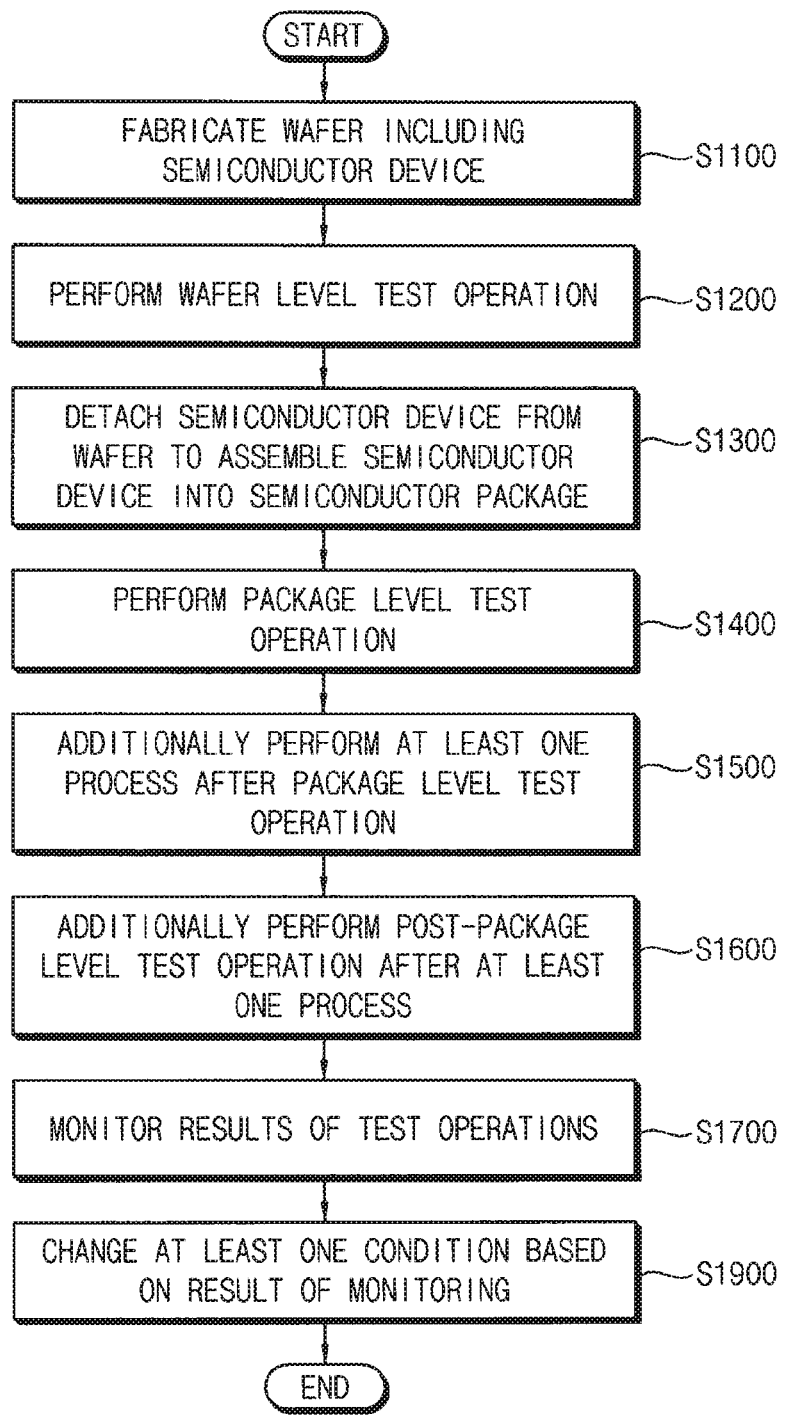

FIGS. 15, 16 and 17 are flowcharts illustrating a method of manufacturing a semiconductor device according to example embodiments.

Referring to FIG. 15, in a method of manufacturing a semiconductor device according to example embodiments, the semiconductor device to be manufactured may be the semiconductor device described with reference to FIGS. 1 through 6.

A wafer including the semiconductor device is fabricated (step S1100). The semiconductor device includes a functional circuit and a plurality of ESD protection circuits formed independently of the functional circuit. Step S1100 in FIG. 15 may be performed by the wafer fabrication equipment 1100 in FIG. 8 or the wafer fabrication equipment 2100 in FIG. 14.

A first test operation (e.g., a wafer level test operation) is performed on the wafer including the semiconductor device using the functional circuit and a first ESD protection circuit among the plurality of ESD protection circuits (step S1200). Step S1200 in FIG. 15 may be substantially the same as step S100 in FIG. 7 or steps S100a-S100x in FIG. 13, and may be performed by the test equipment 1200 in FIG. 8 or the test equipment 2200 in FIG. 14.

The semiconductor device is detached from the wafer to assemble the semiconductor device into a semiconductor package (step S1300). Step S1300 in FIG. 15 may be performed by the package assembly equipment 1300 in FIG. 8 or the package assembly equipment 2300 in FIG. 14.

A second test operation (e.g., a package level test operation) is performed on the semiconductor package including the semiconductor device using the functional circuit and a second ESD protection circuit among the plurality of ESD protection circuits (step S1400). Step S1400 in FIG. 15 may be substantially the same as step S200 in FIG. 7 or steps S200a-S200y in FIG. 13, and may be performed by the test equipment 1400 in FIG. 8 or the test equipment 2400 in FIG. 14.

After the package level test operation, at least one process is additionally performed (step S1500). For example, the at least one process may include a reliability test for the semiconductor package, a set assembly process for mounting the semiconductor package on an electronic device, or the like. Step S1500 in FIG. 15 may be performed by the post-package process equipment 1500 in FIG. 8 or the post-package process equipment 2500 in FIG. 14.

After the at least one process, a third test operation (e.g., a post-package level test operation) for the semiconductor device is additionally and selectively further performed using the functional circuit and a third ESD protection circuit among the plurality of ESD protection circuits (step S1600). Step S1600 in FIG. 15 may be substantially the same as step S300 in FIG. 7 or steps S300a-S300z in FIG. 13, and may be performed by the test equipment 1600 in FIG. 8 or the test equipment 2600 in FIG. 14.

Referring to FIG. 16, an example of FIG. 16 may be substantially the same as an example of FIG. 15, except that operations of monitoring test results and determining ESD margins are added to the example of FIG. 16.

A result of a wafer level ESD test included in the first test operation, a result of a package level ESD test included in the second test operation and a result of a post-package level ESD test included in the third test operation may be monitored (step S1700). All information and history associated with ESD failures and ESD tests may be traced or tracked by the monitoring operation.

At least one of a first ESD margin for the wafer level process, a second ESD margin for the package level process and a third ESD margin for the post-package level process may be determined based on a result of the monitoring operation (step S1800).

For example, when the junctions JC1 and JC2 are defective on average in the wafer level process as the result of the wafer level ESD test, a reference value corresponding to the junction JC2 may be determined as the first ESD margin. As another example, when the junctions JC1, JC2 and JC3 are defective at the maximum in the package level process as the result of the package level ESD test, a reference value corresponding to the junction JC3 may be determined as the second ESD margin. In other words, the ESD margin for each process may be determined based on the junction having the largest size and capacity among the defective junctions.

Referring to FIG. 17, an example of FIG. 17 may be substantially the same as an example of FIG. 15, except that operations of monitoring test results and changing conditions associated with the fabrication of the semiconductor device are added to the example of FIG. 17. Step S1700 in FIG. 17 may be substantially the same as step S1700 in FIG. 16.

At least one of a plurality of conditions associated with the fabrication of the semiconductor device is changed based on a result of the monitoring operation (step S1900).

In some example embodiments, a design condition for the semiconductor device may be changed. For example, the semiconductor device may be re-designed to change a circuit configuration, a layout, and/or another characteristic. In other example embodiments, a process or a process condition for manufacturing the semiconductor device may be changed. For example, process equipment, process orders, various parameters in process, etc., may be tuned. In still other example embodiments, a product specification for the semiconductor device may be changed. According to example embodiments, at least two of the design condition, the process condition and the product specification may be simultaneously or concurrently changed.

After the at least one of the plurality of conditions is changed, steps S1100 through S1700 may be repeated or recursively performed.

In the method of manufacturing the semiconductor device according to example embodiments, the ESD test may be performed in each process using the plurality of ESD protection circuits that are included in the semiconductor device and formed independently of the functional circuit. Thus, it may be efficiently and accurately checked whether the ESD failure (or the defect due to the ESD) occurs in each process, and the ESD level history tracing for each process may be efficiently performed. In addition, the ESD margin may be efficiently determined and/or the at least one condition associated with the fabrication of the semiconductor device may be efficiently changed based on the results of the ESD tests and the ESD level history tracing.

Figure 18:
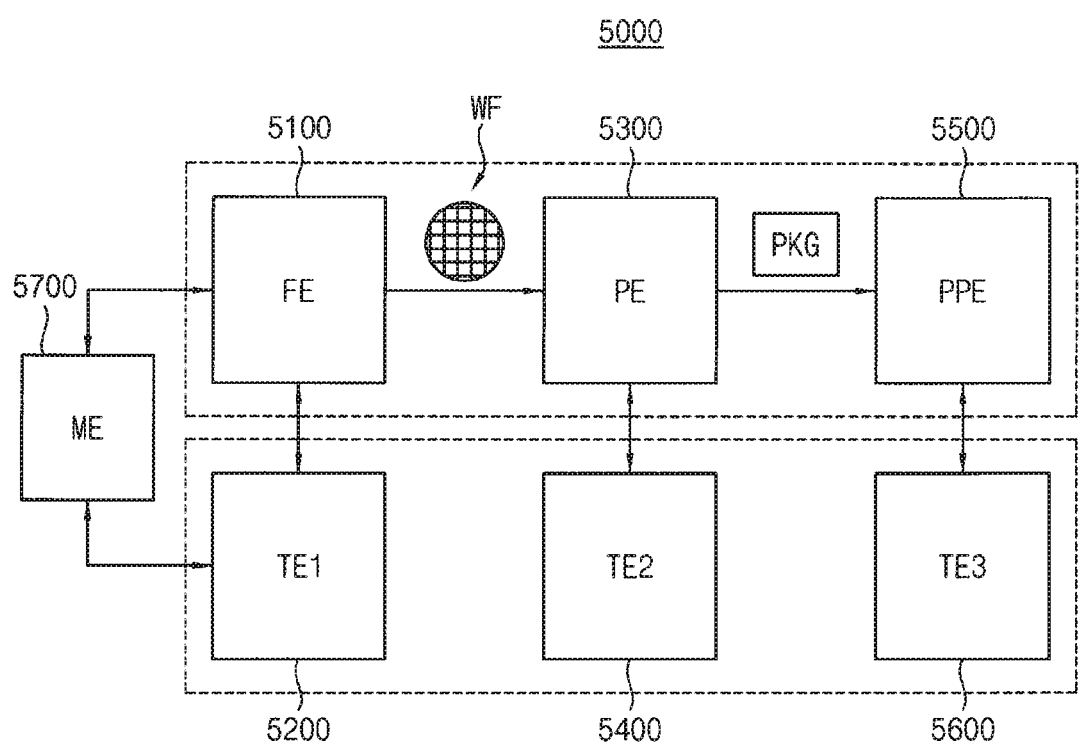
FIG. 18 is a block diagram illustrating a manufacturing/testing system for a semiconductor device according to example embodiments.

FIG. 18 is a block diagram illustrating a manufacturing/testing system for a semiconductor device according to example embodiments. The descriptions repeated with FIG. 8 will be omitted.

Referring to FIG. 18, a manufacturing/testing system 5000 for a semiconductor device includes a wafer fabrication equipment 5100, a package assembly equipment 5300, a post-package process equipment 5500, a plurality of test equipment 5200, 5400 and 5600, and a monitoring equipment (ME) 5700.

The manufacturing/testing system 5000 of FIG. 18 may be substantially the same as the manufacturing/testing system 1000 of FIG. 8, except that the manufacturing/testing system 5000 further includes the monitoring equipment 5700. The wafer fabrication equipment 5100, the package assembly equipment 5300, the post-package process equipment 5500 and the plurality of test equipment 5200, 5400 and 5600 in FIG. 18 may be substantially the same as the wafer fabrication equipment 1100, the package assembly equipment 1300, the post-package process equipment 1500 and the plurality of test equipment 1200, 1400 and 1600 in FIG. 8, respectively.

The monitoring equipment 5700 may monitor results of tests that are performed by the test equipment 5200, 5400 and 5600, and may determine at least one ESD margin for a process associated with the fabrication of the semiconductor device or may change at least one condition associated with the fabrication of the semiconductor device based on a result of the monitoring operation. In other words, the monitoring equipment 5700 may perform steps S1700, S1800 and S1900 in FIGS. 16 and 17.

Figure 19:
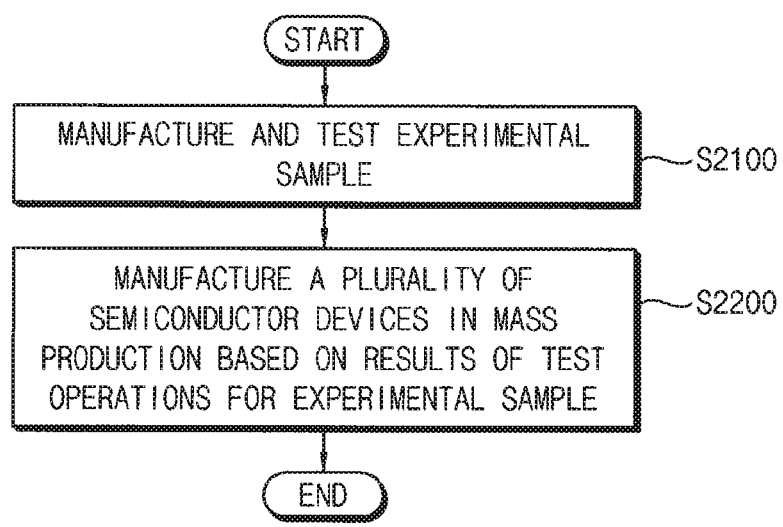
FIG. 19 is a flowchart illustrating a method of manufacturing a semiconductor device according to example embodiments.

FIG. 19 is a flowchart illustrating a method of manufacturing a semiconductor device according to example embodiments.

Referring to FIG. 19, in a method of manufacturing a semiconductor device according to example embodiments, a first semiconductor device is manufactured and tested as an experimental sample before beginning mass production (step S2100). For example, step S2100 in FIG. 19 may be performed including all of steps in FIGS. 16 and 17, or may be performed except steps S1500 and S1600 in FIGS. 16 and 17.

A plurality of second semiconductor devices are manufactured in the mass production based on results of the test operations for the first semiconductor device (step S2200). The second semiconductor device may be substantially the same as the first semiconductor device. In other words, the first and second semiconductor devices may be the same type of semiconductors. For example, the circuit configuration, layout, function, and/or operation of the second semiconductor device may be substantially the same as the circuit configuration, layout, function, and/or operation of the first semiconductor device, respectively. For example, step S2200 in FIG. 19 may be performed including all of steps in FIG. 15, FIG. 16 or FIG. 17.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Example embodiments may be applied in a development/test/manufacturing phase of various types of semiconductor devices. Particularly, the occurrence process of the defect associated with the ESD failure may be accurately identified or confirmed, the ESD failure information of each chip may be efficiently managed and traced from the wafer level up to the set level, and thus the manufacturing cost of the semiconductor device may be reduced and the manufacturing efficiency of the semiconductor device may be increased.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
a substrate;
a functional circuit provided on the substrate;
a plurality of electrostatic discharge (ESD) protection circuits provided on the substrate, wherein each of the plurality of ESD protection circuits includes a plurality of junctions having different sizes and capacities, and each of the plurality of ESD protection circuits is configured to perform an ESD test in different processes of fabrication of the semiconductor device;
a plurality of test pads provided on the substrate, and connected to the plurality of ESD protection circuits and the functional circuit, respectively, wherein each of the plurality of test pads is configured to receive a test signal for the ESD test; and
a storage unit provided on the substrate, electrically connected to the plurality of ESD protection circuits, and configured to store a plurality of results corresponding to the ESD test performed by the plurality of ESD protection circuits, respectively.

2. The semiconductor device of claim 1, wherein the ESD test comprises:
a wafer level ESD test performed on a wafer including the semiconductor device before the semiconductor device is detached from the wafer,
a package level ESD test performed on a semiconductor package including the semiconductor device after the semiconductor device is detached from the wafer and assembled into the semiconductor package, and
a post-package level ESD test further performed after the package level ESD test.

3. The semiconductor device of claim 2, wherein the plurality of ESD protection circuits comprises:
a first ESD protection circuit configured to perform the wafer level ESD test;
a second ESD protection circuit configured to perform the package level ESD test; and
a third ESD protection circuit configured to perform the post-package level ESD test.

4. The semiconductor device of claim 2, wherein the post-package level ESD test is performed on an electronic device that includes the semiconductor package.

5. The semiconductor device of claim 2, wherein the post-package level ESD test comprises a reliability ESD test for the semiconductor package including the semiconductor device.

6. The semiconductor device of claim 1, wherein the plurality of junctions in each of the plurality of ESD protection circuits comprises:
a first junction having a first size and a first capacity;
a second junction having a second size larger than the first size and a second capacity larger than the first capacity; and
a third junction having a third size larger than the second size and a third capacity larger than the second capacity.

7. The semiconductor device of claim 6, further comprising an ESD protection circuit electrically connected to the functional circuit and a test pad, from among the plurality of test pads that corresponds to the ESD protection circuit, wherein the ESD protection circuit is configured to protect the functional circuit from an ESD event,
wherein a size and a capacity of the ESD protection circuit for the functional circuit are the same as the second size and the second capacity, respectively.

8. The semiconductor device of claim 1, wherein each of the plurality of junctions included in each of the plurality of ESD protection circuits comprises a silicon controlled rectifier (SCR).

9. A method of testing a semiconductor device, the method comprising:
performing a first test operation on the semiconductor device disposed on a wafer using a functional circuit and a first electrostatic discharge (ESD) protection circuit from among a plurality of ESD protection circuits included in the semiconductor device, wherein each of the plurality of ESD protection circuits includes a plurality of junctions having different sizes and capacities, and both the functional circuit and the plurality of ESD protection circuits are provided on a substrate of the semiconductor device;

storing first results corresponding to the first test operation in a storage unit that is provided on the substrate, and electrically connected to the first ESD protection circuit;

detaching the semiconductor device from the wafer;

assembling the semiconductor device that has been detached from the wafer into a semiconductor package;

performing a second test operation on the semiconductor package including the semiconductor device using the functional circuit and a second ESD protection circuit, from among the plurality of ESD protection circuits, included in the semiconductor device and electrically connected to the storage unit; and storing second results corresponding to the second test operation in the storage unit.

10. The method of claim 9, wherein the performing the first test operation comprises:

performing a wafer level functional test and a wafer level ESD test by applying a first functional test signal and a first ESD test signal to the functional circuit and the first ESD protection circuit, respectively; and obtaining a wafer level functional test result of the wafer level functional test and a wafer level ESD test result of the wafer level ESD test.

11. The method of claim 9, further comprising performing a third test operation on the semiconductor device using the functional circuit and a third ESD protection circuit from among the plurality of ESD protection circuits.

12. The method of claim 10, further comprising identifying a first ESD margin for fabrication of the wafer including the semiconductor device based on the wafer level ESD test result, wherein the wafer level ESD test result is stored in the storage unit.

13. A method of manufacturing a semiconductor device, the method comprising:

fabricating a wafer including the semiconductor device, wherein the semiconductor device includes a functional circuit and a plurality of electrostatic discharge (ESD) protection circuits, the functional circuit and the plurality of ESD protection circuits are provided on a substrate of the semiconductor device, and each of the plurality of ESD protection circuits includes a plurality of junctions having different sizes and capacities;

performing a first test operation on the semiconductor device disposed on the wafer using the functional circuit and a first ESD protection circuit from among the plurality of ESD protection circuits;

storing first results corresponding to the first test operation in a storage unit that is provided on the substrate, and electrically connected to the first ESD protection circuit;

detaching the semiconductor device from the wafer;

assembling the semiconductor device into a semiconductor package;

performing a second test operation on the semiconductor package including the semiconductor device using the functional circuit and a second ESD protection circuit from among the plurality of ESD protection circuits that is electrically connected to the storage unit; and storing second results corresponding to the second test operation in the storage unit.

14. The method of claim 13, further comprising monitoring at least one of a first test operation result of the first test operation and a second test operation result of the second test operation.

15. The method of claim 14, further comprising identifying at least one from among a first ESD margin for the first test operation based on the first test operation result and a second ESD margin for the second test operation based on the second test operation result.

16. The method of claim 14, further comprising changing at least one of a plurality of conditions associated with fabrication of the semiconductor device based on one from among the first test operation result and the second test operation result.

17. The method of claim 13, wherein the semiconductor device is an experimental sample produced before beginning mass production.

18. The method of claim 17, further comprising mass producing a plurality of second semiconductor devices based on at least one from among a first test operation result of the first test operation and a second test operation result of the second test operation, each of the plurality of second semiconductor devices corresponding to the semiconductor device.

19. The semiconductor device of claim 1, wherein the storage unit comprises any one or any combination of an electrically erasable programmable read-only memory (EEPROM), a flash memory, a phase-change memory (PRAM), a resistive random-access memory (RRAM), a magnetoresistive random-access memory (MRAM), a Ferroelectric random-access memory (FRAM), a nano-floating gate memory (NFGM) and a parallel optical random-access memory (PoRAM).

* * * * *